United States Patent
Yamanouchi

(10) Patent No.: US 9,240,757 B2
(45) Date of Patent: Jan. 19, 2016

(54) TRANSMISSION APPARATUS AND TRANSMISSION METHOD

(71) Applicant: NEC CORPORATION, Tokyo (JP)

(72) Inventor: Shingo Yamanouchi, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 14/433,064

(22) PCT Filed: Oct. 4, 2013

(86) PCT No.: PCT/JP2013/077101
§ 371 (c)(1),
(2) Date: Apr. 2, 2015

(87) PCT Pub. No.: WO2014/054786
PCT Pub. Date: Apr. 10, 2014

(65) Prior Publication Data
US 2015/0207464 A1    Jul. 23, 2015

(30) Foreign Application Priority Data
Oct. 5, 2012 (JP) ................. 2012-223183

(51) Int. Cl.
*H04K 1/02* (2006.01)
*H03F 1/02* (2006.01)
(Continued)

(52) U.S. Cl.
CPC ............ *H03F 1/0233* (2013.01); *H03F 1/0277* (2013.01); *H03F 1/3247* (2013.01);
(Continued)

(58) Field of Classification Search
CPC . H04W 88/06; H04W 52/02; H04W 52/0209; H04W 52/0219; H04B 1/0064; H04B 1/0475; H04B 1/0082; H04B 1/0458; H04B 1/005; H04B 1/04; H04B 1/62; H04B 1/0071; H04B 1/0075; H04B 2001/0433
USPC ............... 455/114.3; 375/297, 296, 260, 256; 330/310, 124, 295, 302, 124 R
See application file for complete search history.

(56) References Cited

U.S. PATENT DOCUMENTS 7,639,990 B2    12/2009 Morioka
7,688,156 B2     3/2010 Matsuura et al.
(Continued)

FOREIGN PATENT DOCUMENTS

JP    2000-349575 A    12/2000
JP    2005-244826 A     9/2005
(Continued)

OTHER PUBLICATIONS

Nobuhiko Miki et al., "Carrier Aggregation for Bandwidth Extension in LTE-Advanced", NTT DoCoMo technical Journal, pp. 12-21, vol. 18, No. 2.
(Continued)

*Primary Examiner* — Rahel Guarino
(74) *Attorney, Agent, or Firm* — Sughrue Mion, PLLC

(57) ABSTRACT

A transmission apparatus comprises a signal generator that generates input signals of two or more bands of frequencies and outputs the generated input signals; a power amplifier that amplifies the input signals and outputs amplified signals; a branching filter that outputs branched signals for the respective frequencies from the amplified signals; a data transmitter that transmits data based on one of the branched signals of a first frequency; a power regenerator that converts one of the branched signals of a second frequency into regenerated power and output the regenerated power, and a power combiner that combines the regenerated power and power supply power output from a voltage source, as combined power and supplies the combined power to the power amplifier.

10 Claims, 35 Drawing Sheets

(51) Int. Cl.
  *H03F 1/32* (2006.01)
  *H03F 3/195* (2006.01)
  *H03F 3/24* (2006.01)
  *H03F 3/68* (2006.01)
  *H03F 3/19* (2006.01)
  *H04B 1/04* (2006.01)

(52) U.S. Cl.
  CPC ............ *H03F 3/19* (2013.01); *H03F 3/195* (2013.01); *H03F 3/24* (2013.01); *H03F 3/245* (2013.01); *H03F 3/68* (2013.01); *H04B 1/04* (2013.01); *H03F 2200/111* (2013.01); *H03F 2200/336* (2013.01); *H03F 2200/451* (2013.01); *H04B 2001/045* (2013.01); *H04B 2001/0408* (2013.01); *H04B 2001/0425* (2013.01)

(56) References Cited

U.S. PATENT DOCUMENTS

| | | | |
|---|---|---|---|
| 7,706,835 | B2 | 4/2010 | Kanazawa |
| 8,718,582 | B2 | 5/2014 | See et al. |
| 2006/0264182 | A1 | 11/2006 | Morioka |
| 2008/0233899 | A1 | 9/2008 | Kanazawa |
| 2009/0079511 | A1 | 3/2009 | Matsuura et al. |
| 2009/0201084 | A1 | 8/2009 | See et al. |
| 2012/0075023 | A1* | 3/2012 | Guo ............ H03F 1/0261 330/296 |

FOREIGN PATENT DOCUMENTS

| | | |
|---|---|---|
| JP | 2005-287017 A | 10/2005 |
| JP | 2006-270923 A | 10/2006 |
| JP | 2006-324878 A | 11/2006 |
| JP | 2008-205821 A | 9/2008 |
| JP | 2008-278096 A | 11/2008 |
| JP | 2008-539601 A | 11/2008 |
| JP | 4413244 B2 | 2/2010 |
| JP | 2011-512098 A | 4/2011 |
| JP | 2011-097320 A | 5/2011 |
| JP | 2011-205793 A | 10/2011 |

OTHER PUBLICATIONS

Shouhei Kousai et al., "An Octave-Range, Watt-Level, Fully-Integrated CMOS Switching Power Mixer Array for Linearization and Back-Off-Efficiency Improvement," IEEE Journal of Solid-State Circuits, Dec. 2009, pp. 3376-3392, vol. 44, No. 12.

Paul Saad et al., "Design of a Highly Efficient 2-4-GHz Octave Bandwidth GaN-HEMT Power Amplifier," IEEE Transactions on Microwave Theory and Techniques, Jul. 2010, pp. 1677-1685, vol. 58, No. 7.

International Search Report of PCT/JP2013/077101 dated Jan. 7, 2014.

* cited by examiner

TRANSMISSION APPARATUS AND TRANSMISSION METHOD

CROSS REFERENCE TO RELATED APPLICATIONS

This is a National Stage of International Application No. PCT/JP2013/077101 filed Oct. 4, 2013, claiming priority based on Japanese Patent Application No. 2012-223183 filed Oct. 5, 2012, the contents of all of which are incorporated herein by reference in their entirety.

TECHNICAL FIELD

Reference to Related Application

This application is based upon and claims the benefit of the priority of Japanese Patent Application No. 2012-223183 filed on Oct. 5, 2012, the disclosure of which is incorporated herein in its entirety by reference thereto.

The present invention relates to a transmission apparatus, and a transmission method. More specifically, the invention relates to a transmission apparatus and a transmission method that transmits RF (Radio Frequency) signals of a plurality of bands.

BACKGROUND

Among components of a radio communication apparatus, a power amplifier for transmission used in the radio communication apparatus, in particular, consumes power most. Thus, reduction of power consumption by the power amplifier (Power Amplifier, PA) is regarded as the most important challenge for development of the radio communication apparatus.

In a recent communication standard, a linear modulation method has become a mainstream for spectrum efficiency improvement. In the linear modulation method, signal amplitude indicates a temporal fluctuation. Being different from a frequency modulation method using a constant signal amplitude, the linear modulation method imposes a rigorous requirement against distortion of a transmission signal. As a measure against this distortion, average output power of the transmission signal is set such that instantaneous maximum output (peak) power of the transmission signal is not more than the saturation output of a power amplifier. The distortion of the transmission signal can be thereby reduced.

However, generally, power efficiency of the power amplifier is reduced as the average output power is reduced to be low with respect to the saturation output power (as a back-off amount is increased). The power efficiency of the power amplifier is determined by a ratio between transmission power output from the power amplifier and power (power consumption) supplied to the power amplifier from a power source. Reduction of the power efficiency unnecessarily increases the power consumption with respect to the transmission power of a desired level. Thus, a method of reducing power consumption of the power amplifier even if a back-off amount is set has been developed.

An example of a method of maintaining power efficiency of a power amplifier to be high and reducing power consumption of the power amplifier regardless of a temporal amplitude variation of a linearly modulated signal is disclosed in Patent Literature 1. FIG. 30 is a block configuration diagram illustrating a block configuration of a transmission apparatus described in Patent Literature 1. In the transmission apparatus in FIG. 30, a linearly modulated signal supplied to a terminal 11 is converted to two frequency-modulated signals $V_1$ and $V_2$ through a series-parallel converter 12, filters 13 and 14, and an operation circuit 15. The frequency-modulated signals $V_1$ and $V_2$ are respectively supplied to power amplifiers 16 and 17. Since amplitudes of the frequency-modulated signals $V_1$ and $V_2$ each have a constant value that does not temporarily vary, there is no need for setting back-off for each of the power amplifiers 16 and 17. High power efficiency is thereby maintained. Frequency-modulated signals $S_1$ and $S_2$ amplified and output by the power amplifiers 16 and 17 are supplied to a power combiner 18 through terminals 2 and 3. The power combiner 18 combines the signals $S_1$ and $S_2$ to regenerate an amplified signal of the linearly modulated signal supplied to the terminal 11 and outputs the regenerated signal to a terminal 4 and a load 9.

A differential signal between the frequency-modulated signals S1 and S2 is output to a terminal 5 from the power combiner 18. Usually, the terminal 5 is terminated by a resistor, so that power of the differential signal becomes a loss due to the termination by the resistor. Then, in the method illustrated in FIG. 30, a rectifier circuit 20 and filters 19 and 21 are installed after the terminal 5. The differential signal output to the terminal 5 is converted into direct-current power to be output to a terminal 22. The direct-current power output to the terminal 22 is reused as power to be supplied to the power amplifiers 16 and 17, thereby reducing wasteful power consumption. Power saving of the PAs is implemented by the above-mentioned method.

Another example of the method of maintaining power efficiency of a power amplifier to be high and reducing power consumption of the power amplifier regardless of a temporal amplitude variation of a linearly modulated signal is disclosed in Patent Literature 2. FIG. 31 is a block configuration diagram showing a block configuration of a transmission apparatus described in Patent Literature 2.

In the transmission apparatus in FIG. 31, a phase-modulated signal obtained by excluding an amplitude component from a transmission signal is generated by a signal generation unit 31 and an angle modulation unit 32. The phase-modulated signal is supplied to each of power amplifiers 551 and 552 through a directional coupler 61. Since the phase-modulated signal has a constant amplitude, there is no need for setting back-off for each of the power amplifiers 551 and 552. High power efficiency is thereby maintained. Further, an amplitude signal obtained by removing a phase component from the transmission signal is amplified by a variable gain amplifier 28 and a regulator 34. Then, the amplitude signal is supplied to power supply terminals of the power amplifiers 551 and 552. The phase-modulated signal is supplied to each of the power amplifiers 551 and 552, and the power supply terminals are modulated by the amplitude signal. Thus, the transmission signal including the amplitude component and the phase component is regenerated to be output to an output terminal 37 through a directional coupler 62. When power of the transmission signal is large, a switch 53 is turned on to supply the power to the power amplifier 551, and the power amplifiers 551 and 552 are both operated. When the power of the transmission signal is small, the switch 53 is turned off, thereby stopping supply of the power to the power amplifier 551, and the power amplifier 552 is operated. Power saving is thereby attempted.

In the transmission apparatus in FIG. 31, a differential signal between outputs of the power amplifiers 551 and 552 is output to a power reuse unit 63 from the directional coupler 62. Usually, power of the differential signal between the outputs of the power amplifiers 551 and 552 is consumed wastefully. Then, in the method in FIG. 31, the differential signal is converted into direct-current power by the power reuse unit 63 to be output to a terminal 33. The direct-current power supplied to the terminal 33 is reused as the power to be supplied to the power amplifier 551 and power to be supplied to the power amplifier 552 through the regulator 34. Wasteful power consumption is thereby reduced. Power saving of the PAs is implemented by the above-mentioned method.

Still another example of the method of maintaining power efficiency of a power amplifier to be high and reducing power consumption of the power amplifier regardless of a temporal amplitude variation of a linearly modulated signal is disclosed in Patent Literature 3. FIG. 32 is a block configuration diagram showing a block configuration of a transmission apparatus described in Patent Literature 3.

In the transmission apparatus in FIG. 32, a baseband is output from a data generator 101. The baseband signal is converted to a digital signal through a vector data converter 102 and a modulator 103 to be supplied to a power amplifier 104. Since the digital signal has a constant amplitude, there is no need for setting back-off for the power amplifier 104. High power efficiency is thereby maintained. The digital signal is amplified by the power amplifier 104 and is then output. Then, the digital signal is supplied to a filer 108 through an isolator 105. The filter 108 converts the digital signal to an RF signal obtained by removing a quantization error of the digital signal and superimposing the baseband signal thereon, and outputs the RF signal to a terminal 109.

The quantization error removed by the filer 108 is output to a terminal c of the isolator 105. Usually, the terminal c of the isolator 105 is terminated by a resistor, and power of the quantization error becomes a loss due to the termination by the resistor. Then, in the method in FIG. 32, a power reuse unit 106 is connected to the terminal c of the isolator 105, and the power of the quantization error is converted to direct-current power and is reused as a portion of direct-current power to be supplied from a power supply unit 107 to the power amplifier 104. Power loss reduction is thereby provided.

An example of a method of providing power saving of a transmission apparatus by reuse of loss power is disclosed in Patent Literature 4. FIG. 33 is a block configuration diagram showing a block configuration of the transmission apparatus described in Patent Literature 4.

In the transmission apparatus in FIG. 33, an RF signal output from a signal source 270 is amplified by a power amplifier 220. The RF signal is then output to an antenna 210 through an isolator 240. A portion of the RF signal supplied to the antenna 210 is reflected due to a matching deviation. Unless the isolator 240 is installed, reflected power of the RF signal becomes a loss at an output terminal of the power amplifier 220. Then, in the transmission apparatus in FIG. 33, the isolator 240 is installed, the reflected power of the RF signal is output to a recovery unit 230 through the isolator 240, so that the reflected power of the RF signal is converted to direct-current power by the recovery unit 230. A switching unit 260 selects the recovery unit 230 or a battery unit 250, and supplies the direct-current power output from the recovery unit 230 or direct-current power output from a battery unit 250 to the power amplifier 220, a signal source 270, and a configuration unit 280. The configuration unit 280 is a circuit in general necessary for configuring a radio apparatus. As mentioned above, the transmission apparatus in FIG. 33 reuses the power reflected from the antenna that may usually become the loss, as power to be supplied to the circuit. Power saving of the transmission apparatus is thereby implemented.

Another example of implementing power saving of a transmission apparatus by reuse of loss power is disclosed in Patent Literature 5. FIG. 34 is a block configuration diagram showing a block configuration of the transmission apparatus described in Patent Literature 5.

In the transmission apparatus in FIG. 34, a communication processing unit 324 operates upon receipt of supply of power from a power supply unit 320, and transmits a data signal received from a control unit 316. The communication processing unit 324 outputs an RF signal for transmission to a transmitting antenna 328. A portion of the RF signal emitted into the air from the transmitting antenna 328 is supplied to a power recovery antenna 304. The RF signal supplied to the power recovery antenna 304 is converted into direct-current power by a rectifier circuit 308, and the direct-current power is supplied to a power use unit 312. The power use unit 312 is a circuit in general configured to use power. As mentioned above, in the transmission apparatus in FIG. 34, a portion of the power of the RF signal emitted from the transmitting antenna 328 into the air is reused, thereby attempting power saving of the transmission apparatus.

In recent radio technologies, while power saving of a transmission apparatus is a major challenge, implementation of radio communication at a higher speed is also demanded. As shown in Non Patent Literature 1, a Carrier aggregation technology (hereinafter referred to as a CA technology) configured to aggregate and use a plurality of fragmented bands is employed for implementing such high-speed radio communication. In this CA technology, the plurality of bands are aggregated to secure a wide band. A transmission speed can be thereby increased.

In an Inter-band Non-contiguous CA mode in which respective carrier frequencies are greatly spaced apart to each other (a difference Δf between the respective carrier frequencies is sufficiently larger than a modulated bandwidth fBB of each carrier RF signal), by performing simultaneous communication using a plurality of the carrier frequencies having different propagation characteristics, stability of the communication can be improved. Further, by applying the CA technology, communication that accommodates a case where band allocation for a plurality of operators is non-contiguous, or a case where the plurality of operators share a band can be performed.

In a communication system using the CA technology, a transmission apparatus and a transmission method configured to transmit RF signals of a plurality of bands (bands) are needed. Improvement in power efficiency is demanded for such a transmission apparatus as well.

FIG. 35 is a functional configuration diagram of a transmitter according to the technique described in Patent Literature 6. The transmitter illustrated in FIG. 35 has a function of transmitting RF signals of a plurality of bands and also has a function of improving power efficiency by application of a polar modulation technique.

Specifically, in the transmitter illustrated in FIG. 35, a modulated signal generated by a modulated signal generator 461 is converted to a signal in a polar coordinate system from a signal in an orthogonal coordinate system to be separated into a PM signal including phase information and an AM signal including amplitude information. The PM signal obtained by the separation is used for phase modulation for a frequency generator 411 through a PM control unit 463. Similarly, the AM signal is used for power supply modulation for PAs 421 and 431 through a power supply modulator 464. That is, the polar modulation technique is applied which increases or decreases power to be supplied from the power supply modulator 464 to each of the PAs 421 and 431, as well, according to an increase or a decrease in power output from each of the Pas 421 and 431. Reduction in the power efficiency is suppressed even in a high back-off state where average output power is set to be low.

The transmitter illustrated in FIG. 35 includes path selection switches 414 and 441 configured to perform switching between a GSM (registered trademark) (Global System for Mobile Communications) signal path 420 in which the PA 421 is provided and a UMTS signal path 430 in which the PA 431 is provided. The PA 421 amplifies an RF signal in a (GSM) communication system for a carrier frequency fc1, while the PA 431 amplifies an RF signal in a (Universal Mobile Telecommunications System, UMTS) communication system for a carrier frequency fc2. When communication is performed in the communication system for the carrier frequency fc1, switching of the path selection switches 414 and 441 is performed by a control signal from a controller 415 such that the RF signal is supplied to and output from the PA 421. When communication is performed in the communication system for the carrier frequency fc2, switching of the path selection switches 414 and 441 is performed by the control signal from the controller 415 such that the RF signal is supplied to or output from the PA 431.

The transmitter illustrated in FIG. 35 does not accommodate the CA technology whereby two desired frequency components fc1 and fc2 are simultaneously output. However, the transmitter illustrated in FIG. 35 has a multi-band operation function configured to temporally perform switching between the frequency components fc1 and fc2 to operate one of the frequencies.

A technique where the polar modulation technique is applied to each PA to maintain power efficiency to be high even if average output power has been set to be low is also disclosed in each of Patent Literature 7, Patent Literature 8, Patent Literature 9, and Patent Literature 10. In this polar modulation technique, as in the transmitter illustrated in FIG. 35, the PAs, being equal in number to bands for use, are provided. Then, the PAs are respectively assigned for each band. A band selection switch is installed for an input or an output of each PA. The switch is switched such that an RF signal is supplied to and output from the PA corresponding to the band during use, thereby controlling power to be supplied from a power source.

PTL 1
JP Patent Kokai Publication No. JP2000-349575A
PTL 2
JP Patent Kohyo Publiciation No. JP2008-539601A
PTL 3
JP Patent Kokai Publication No. JP2005-287017A
PTL 4
JP Patent No. 4413244
PTL 5
JP Patent Kokai Publication No. JP2011-205793A
PTL 6
JP Patent Kokai Publication No. JP2006-324878A
PTL 7
JP Patent Kohyo Publication No. JP2011-512098A
PTL 8
JP Patent Kokai Publication No. JP2005-244826A
PTL 9
JP Patent Kokai Publication No. JP2006-270923A
PTL 10
JP Patent Kokai Publication No. JP2008-205821A
NON PATENT LITERATURE
NPL 1
Nobuhiko Miki, et. al., "Carrier Aggregation for Bandwidth Extension in LTE-Advanced," NTT DoCoMo technical Journal, Vol. 18, No. 2

NPL 2
S. Kousai, et. Al., "An Octave-Range Watt-Level, Fully-Integrated CMOS Switching Power Mixer Array for Linearization and Back-Off-Efficiency," IEEE Journal of Solid-State Circuits, vol. 44, no. 12, pp. 3376-3392, 2009
NPL 3
P. Saad, et. al., "Design of a Highly Efficient 2-4 GHz Octave Bandwidth GaN-HEMT Power Amplifier," IEEE Transactions on Microwave Theory and Techniques, vol. 58, no. 7, pp. 1677-1685, 2010

SUMMARY

Description of the above-mentioned Patent Literatures and Non Patent Literatures is incorporated herein by reference. The following analysis is given by the present invention.

In the case of the technique described in each of Patent Literatures 1 and 2, the power combiner 18 in FIG. 30 and the directional coupler 62 in FIG. 31 are each implemented by a circuit using a $\lambda/4$ line such as a 90° branch-line hybrid. The $\lambda/4$ line, however, has a characteristic of great frequency dependence. Thus, the frequency to be designed according to the technique described in each of Patent Literatures 1 and 2 is substantially limited to one band. Consequently, the technique described in each of Patent Literatures 1 and 2 cannot accommodate the CA technology configured to simultaneously use a plurality of bands for transmission. Further, in the technique described in each of Patent Literatures 1 and 2, two PAs are used. However, the circuit size and cost increases due to an increase in the number of the power amplifiers.

In the case of the technique described in Patent Literature 3, components of the quantization error to be used for reuse of the power distributes over a wide range of frequencies from the frequency of a direct current to several times of the carrier frequency of the RF signal. However, the isolator 105 and the power reuse unit 106 configured to accommodate the wide range of frequencies from the frequency of the direct current to the several times of the carrier frequency cannot be implemented by current technology. Consequently, power of a quantization error component that is not within a frequency range accommodated by the isolator 105 and the power reuse unit 106 cannot be reused, so that a power loss is produced.

In the case of the technique described in Patent Literature 4, a condition that allows power saving by reuse of power is limited to the case where the reflected power is produced at the antenna 210 due to the matching deviation. That is, in a situation where matching is achieved at the antenna 210, the effect of power saving cannot be obtained by the technique described in Patent Literature 4, regardless of whether a back-off amount is large or small.

In the case of the technique described in Patent Literature 5, power that can be recovered by the power recovery antenna 304 is just a portion of power of the RF signal emitted from the transmitting antenna 328 into the air. Consequently, the actual effect of power saving is limited to be small. In the case of the technique described in Patent Literature 5, the frequency and the power of the RF signal emitted from the transmitting antenna 328 into the air are constrained by the Radio Law. Consequently, the power that can be collected by the power recovery antenna 304 is also constrained by the Radio Law.

Meanwhile, in the case of the technique described in each of Patent Literatures 6 to 10 configured to accommodates multi-band transmission and improve power efficiency at a time of back-off, it is necessary to install the power amplifiers being equal in number to the bands for use. This leads to an increase in the circuit size and cost especially in a communication system where the number of bands for use is large.

In the case of the technique described in each of Patent Literatures 6 to 10, a method of switching the power amplifier for use by the band selection switch is employed. Thus, the RF signals of all the bands that are accommodated by the transmitter cannot be simultaneously output. For this reason, the transmitter using this technique is not suited to the CA technology configured to perform communication by simultaneously using a plurality of bands.

In the case of the technique described in each of Patent Literature 2 and Patent Literatures 6 to 10 to which the polar modulation technique of controlling power from the power source to each PA in order to maintain high power efficiency at a time of back-off is applied, an error of the RF output signal of each PA is reduced. Consequently, the power source circuit needs to output power correctly corresponding to the RF output signal of the PA. However, in high-speed radio communication in recent years, the modulation speed of an RF signal ranges from several MHz to several dozen MHz. Thus, it is difficult to output, from the power source circuit, power that varies at such a high speed, with a high accuracy. For this reason, it is difficult to apply the polar modulation technique to the high-speed radio communication in the recent years in terms of compatibility between the accuracy and the modulation speed of the RF signal of the PA.

Then, there is a need in the art to contribute to reducing power consumption regardless of a variation of output power and contributes to reducing power consumption also by accommodating a CA technology configured to simultaneously transmit signals of a plurality of frequencies.

According to a first aspect of the present invention, there is provided a transmission apparatus comprising:
a signal generator that generates input signals of two or more bands of frequencies and outputs the generated input signals;
a power amplifier that amplifies the input signals and outputs amplified signals;
a branching filter that outputs branched signals for the respective frequencies from the amplified signals;
a data transmitter that transmits data based on one of the branched signals of a first frequency;
a power regenerator that converts one of the branched signals of a second frequency into regenerated power and outputs the regenerated power; and
a power combiner that combines the regenerated power and power supply power output from a voltage source, as combined power, and supplies the combined power to the power amplifier.

According to a second aspect of the present invention, there is provided a signal transmission method using a transmission apparatus comprising a power amplifier that amplifies input signals and outputs amplified signals, the transmission method comprising:
generating the input signals of bands of two or more frequencies and outputting the generated input signals;
outputting branched signals for the respective frequencies from the amplified signals;
transmitting data based on one of the branched signals of a first frequency;
converting one of the branched signals of a second frequency into regenerated power and outputting the regenerated power; and
combining the regenerated power and power supply power output from a voltage source as combined power and supplying the combined power to the power amplifier.

This method is linked to a particular machine that is the transmission apparatus comprising the power amplifier that amplifies the input signals and output amplified signals of the input signals.

According to each aspect of the present invention, there is provided a compact and a low-cost transmission apparatus and a transmission method that can contribute to reduction of power consumption regardless of a variation of output power and contributes to the reduction of power consumption also by accommodating a CA technology configured to simultaneously transmit signals of a plurality of frequencies.

PREFERRED MODES

Figure 1:
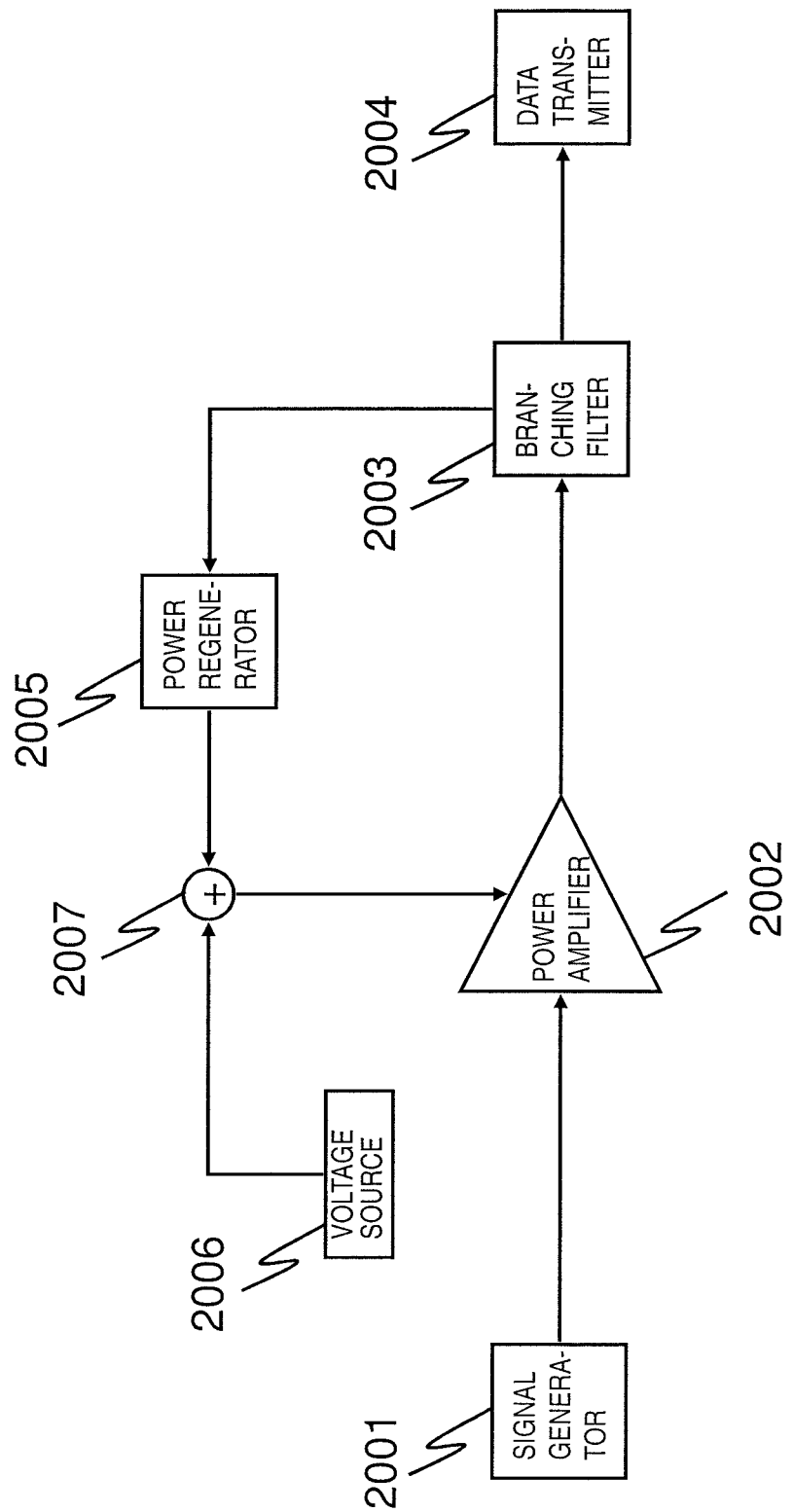
FIG. 1 is a diagram for describing an overview of an exemplary embodiment.

A Preferred exemplary embodiment of a transmission apparatus and a transmission method disclosed in this application will be described, with reference to the drawing. A reference sign in each drawing appended to this overview is appended to each element for convenience, as an example for helping understanding, and description of this overview does not intend any limitation. The same reference sign will be assigned to the same or corresponding element in each drawing that will be illustrated below, for illustration, and repeated description of the same or corresponding element will be omitted.

The overview of this exemplary embodiment will be first described before description of detailed exemplary embodiments. As mentioned above, a compact and a low-cost transmission apparatus is desired which can contribute to reduction of power consumption regardless of a variation in output power and can contribute to the reduction of power consumption also by accommodating a CA technology configured to simultaneously transmit signals of a plurality of frequencies.

Then, a transmission apparatus illustrated in FIG. 1 will be provided as an example. The transmission apparatus illustrated in FIG. 1 comprises a signal generator 2001 that generates input signals of two or more frequency bands and outputs the generated input signals, a power amplifier 2002 that amplifies the input signals and outputs amplified signals, a branching filter 2003 that outputs branched signals for the respective frequencies from the amplified signals, a data transmitter 2004 that transmits data based on one of the branched signals of a first frequency, a power regenerator 2005 that converts one of the branched signals of a second frequency into regenerated power and output the regenerated power, and a power combiner 2007 that combines the regenerated power and power supply power output from a voltage source 2006 as combined power and supplies the combined power to the power amplifier 2002.

First, the signal generator 2001 generates the input signals of the two or more frequency bands. The input signals herein include the signal of the first frequency and the signal of the second frequency. Specifically, the signal of the first frequency means the signal of the frequency to be output to an outside. Meanwhile, the signal of the second frequency means the signal of the frequency to be converted into the regenerated power.

Then, the power amplifier 2002 amplifies the generated input signals and outputs the signals that have been amplified (hereinafter referred to as the amplified signals). Then, the branching filter 2003 extracts the signals for the respective frequencies from the amplified signals. Specifically, the branching filter 2003 extracts from the amplified signals the signal of the first frequency and the signal of the second frequency. Then, the data transmitter 2004 outputs the signal of the first frequency to the outside.

The power regenerator 2005 converts the signal of the second frequency into the regenerated power. The power combiner 2007 combines the regenerated power and the power supply power output from the voltage source 2006. Then, the power combiner supplies the combined power to the power amplifier 2002.

In other words, the transmission apparatus illustrated in FIG. 1 regenerates the signal of a frequency band for power regeneration output from the power amplifier 2002 into the power by the power regenerator, and reuses the power as the power to be supplied to the power amplifier 2002. For that reason, the transmission apparatus illustrated in FIG. 1 can reduce power consumption by the power amplifier 2002, irrespective of a variation in output power. Accordingly, the transmission apparatus illustrated in FIG. 1 can implement the compact and low-cost transmission apparatus that accommodates the CA technology configured to simultaneously transmit the signals of the plurality of frequencies.

The detailed exemplary embodiments will be described in further detail, with reference to the drawings.

First Exemplary Embodiment

A first exemplary embodiment will be described in detail, using the drawings.

Figure 2:
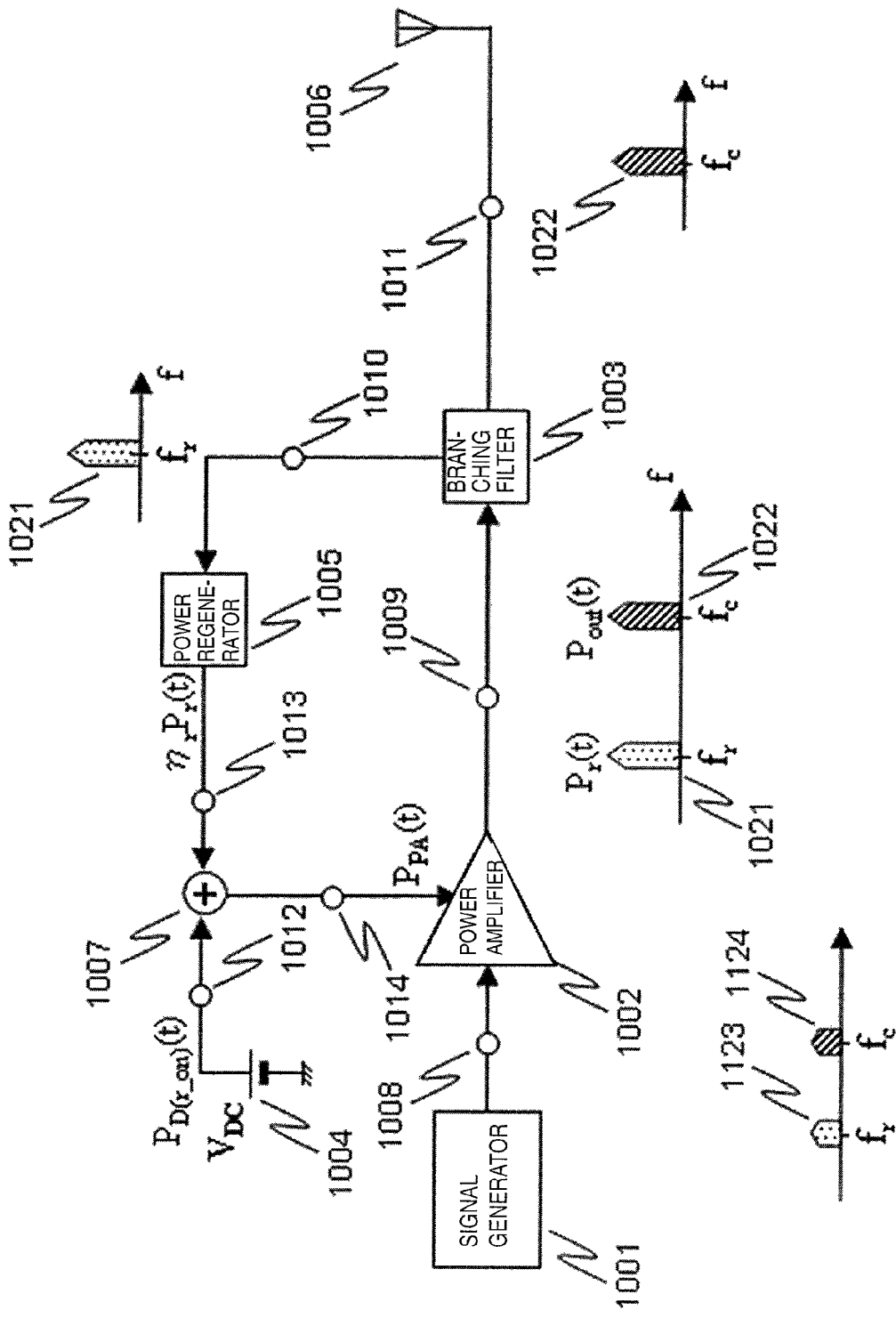
FIG. 2 is a block configuration diagram illustrating a block configuration of a transmission apparatus according to a first exemplary embodiment.

FIG. 2 is a block configuration diagram showing a block configuration of a transmission apparatus according to the first exemplary embodiment. The transmission apparatus according to the first exemplary embodiment illustrated in FIG. 2 is configured by comprising at least a signal generator 1001, a power amplifier 1002, a branching filter 1003, a direct-current voltage source 1004, a power regenerator 1005, a transmitting antenna 1006, and a power combiner 1007. An output of the signal generator 1001 and an input to the power amplifier 1002 are connected through a terminal 1008. An output of the power amplifier 1002 and an input to the branching filter 1003 are connected through a terminal 1009. One of outputs of the branching filter 1003 and an input to the power regenerator 1005 are connected through a terminal 1010. The other of the outputs of the branching filter 1003 and the transmitting antenna 1006 are connected through a terminal 1011. An output of the direct-current voltage source 1004 is connected to an input to the power combiner 1007 through a terminal 1012. An output of the power regenerator 1005 is connected to an input to the power combiner 1007 through a terminal 1013. An output of the power combiner 1007 is connected to a power supplying terminal 1014 of the power amplifier 1002.

The signal generator 1001 generates input signals of two or more frequency bands and outputs the generated input signals. Specifically, the signal generator 1001 simultaneously supplies to the power amplifier 1002 a data transmitting RF signal (corresponding to the above-mentioned signal of the first frequency) of a carrier frequency $f_c$ (corresponding to the above-mentioned first frequency) 1124 and a power regenerating RF signal (corresponding to the above-mentioned signal of the second frequency) of a carrier frequency $f_r$ (corresponding to the above-mentioned second frequency) 1123.

The power amplifier 1002 amplifies the input signals generated by the signal generator and outputs amplified signals of the input signals. Specifically, the power amplifier 1002 amplifies the input data transmitting RF signal 1124 and the input power regenerating RF signal 1123 to simultaneously output to the terminal 1009 as a data transmitting RF signal 1022 and a power regenerating RF signal 1021, respectively.

The branching filter 1003 outputs from the amplified signals branched signals for respective frequencies. Specifically, the branching filter 1003 outputs the input RF signals to the output terminals that are different for the respective carrier frequencies. The branching filter 1003 outputs the data transmitting RF signal 1022 of the carrier frequency $f_c$ to the transmitting antenna 1006 through the terminal 1011, and outputs the power regenerating RF signal 1021 of the carrier frequency $f_r$ to the power regenerator 1005 through the terminal 1010.

The power regenerator 1005 converts the signal of the carrier frequency fr out of the branched signals into regenerated power. Then, the power regenerator 1005 outputs the regenerated power. Specifically, the power regenerator 1005 converts the input power regenerating RF signal 1021 into low frequency power (corresponding to the above-mentioned regenerated power) and outputs the low frequency power to the power combiner 1007 through the terminal 1013.

The direct-current voltage source 1004 outputs power to the power combiner 1007 through the terminal 1012 while applying a constant voltage $V_{DC}$ to the terminal 1012.

The power combiner 1007 combines the regenerated power and the power output by the direct-current voltage source, as combined power. Then, the power combiner 1007 supplies the combined power to the power amplifier 1002. That is, the power combiner 1007 outputs the combined power obtained by combining the power supplied from the power regenerator 1005 and the power from the direct-current voltage source 1004 to the power supplying terminal 1014 of the power amplifier 1002.

Power efficiency of a power amplifier is improved as output power increases. Then, in this exemplary embodiment illustrated by the transmission apparatus in FIG. 2, the data transmitting RF signal 1022 and the power regenerating RF signal 1021 are simultaneously output from the power amplifier 1002. The output power and the power efficiency of the power amplifier 1002 are thereby increased more than that in an operation of outputting the data transmitting RF signal 1022. Further, the power of the power regenerating RF signal 1021 output from the power amplifier 1002 is reused as the power to be supplied to the power amplifier 1002 through the power regenerator 1005. Power consumption of the power amplifier 1002 is reduced more than that in the operation of outputting the data transmitting RF signal 1022.

In this exemplary embodiment, the carrier frequency $f_c$ of the data transmitting RF signal 1124 is set according to a communication standard to be used, in this exemplary embodiment. On the other hand, the carrier frequency $f_r$ of the power regenerating RF signal 1123 may be arbitrarily set.

Figure 3:
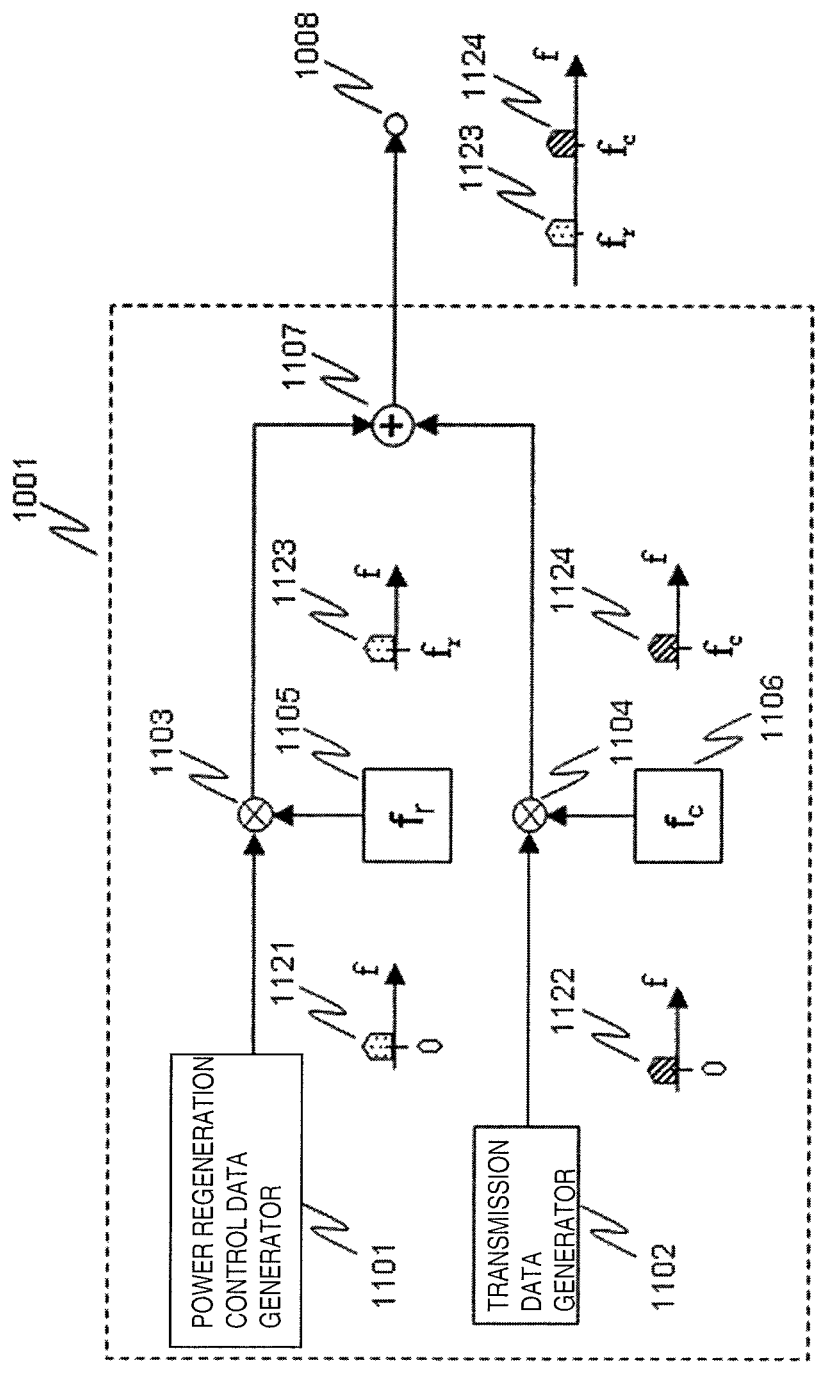
FIG. 3 is a block diagram illustrating a block configuration of a signal generator in the transmission apparatus in the first exemplary embodiment.

FIG. 3 is a block configuration diagram illustrating an example of an internal configuration of the signal generator 1001. The signal generator 1001 is configured by comprising at least a power regeneration control data generator 1101, a transmission data generator 1102, mixers 1103 and 1104, local oscillator (LO) signal generators 1105 and 1106, and an RF signal combiner 1107.

The power regeneration control data generator 1101 of the signal generator 1001 outputs a power regeneration controlling baseband signal 1121 to the mixer 1103. The LO signal generator 1105 outputs an LO signal of the carrier frequency $f_r$ for power regeneration to the mixer 1103. The power regeneration controlling baseband signal 1121 and the LO signal of the carrier frequency $f_r$ for power regeneration are mixed by the mixer 1103, so that the power regenerating RF signal 1123 of the carrier frequency $f_r$ is output to the RF signal combiner 1107. The transmission data generator 1102 outputs a data transmitting baseband signal 1122 to the mixer 1104. The LO signal generator 1106 outputs an LO signal of the carrier frequency $f_c$ for data transmission to the mixer 1104. The data transmitting baseband signal 1122 and the LO signal of the carrier frequency $f_c$ for data transmission are mixed by the mixer 1104, so that the data transmitting RF signal 1124 of the carrier frequency $f_c$ is output to the RF signal combiner 1107. The RF signal combiner 1107 combines the input power regenerating RF signal 1123 and the input data transmitting RF signal 1124, for output to the terminal 1008.

Figure 4:
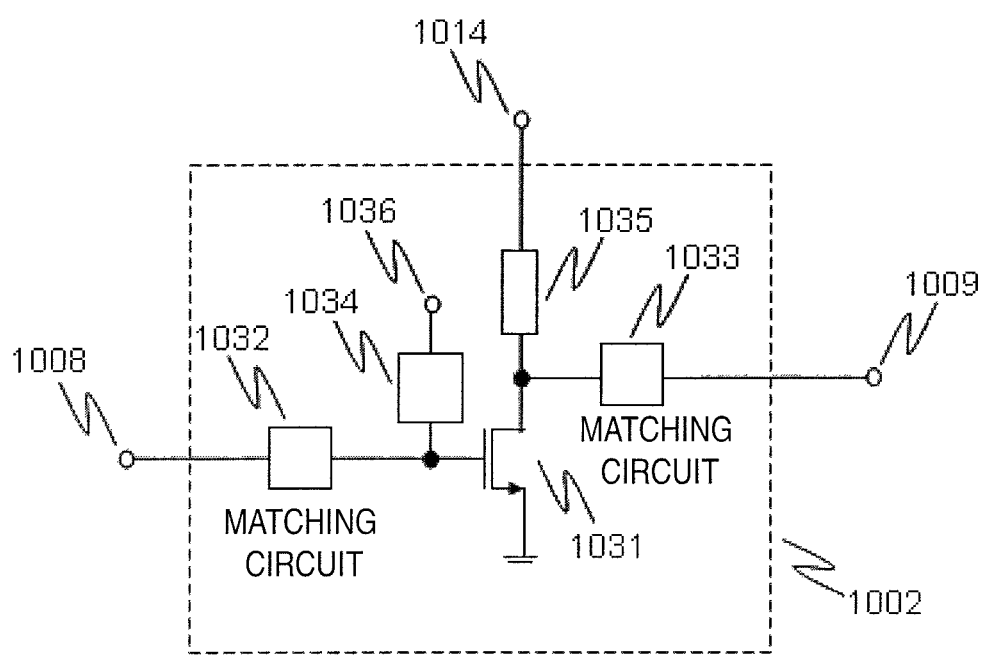
FIG. 4 is a block configuration diagram illustrating a block configuration of a power amplifier in the transmission apparatus in the first exemplary embodiment.

FIG. 4 is a block configuration diagram illustrating an example of an internal configuration of the power amplifier 1002. The power amplifier 1002 comprises at least a transistor 1031, matching circuits 1032 and 1033, an input bias circuit 1034, an output bias circuit 1035, and a bias terminal 1036 of the input bias circuit 1034.

The type of the transistor 1031 of the power amplifier 1002 may be arbitrary, and any one of a field effect transistor and a bipolar transistor may be used. The output bias circuit 1035 has a function of preventing the RF signals output from the transistor 1031 from being output to the power supplying terminal 1014. Preferably, the output bias circuit 1035 is implemented by a chalk inductor or a λ/4 line. Preferably, the output voltage $V_{DC}$ of the direct-current voltage source 1004 in FIG. 2 is applied to the bias terminal 1036 of the input bias circuit 1034 which is a regulator that converts the voltage applied to the bias terminal 1036 to a desired voltage and outputs the converted voltage to an input terminal of the transistor 1031.

The matching circuit 1032 of the power amplifier 1002 is a circuit that takes impedance matching between the input to the transistor 1031 and the output of the signal generator 1001. The matching circuit 1033 is a circuit that takes impedance matching between the output of the transistor 1031 and the input to the branching filter 1003. The RF signals 1123 and 1124 supplied to the terminal 1008 are supplied to the transistor 1031 through the matching circuit 1032. The RF signals 1123 and 1124 are amplified by the transistor 1031 and are output to the terminal 1009 as the RF signals 1021 and 1022 through the matching circuit 1033.

In the first exemplary embodiment illustrated by FIGS. 2 to 4, the power amplifier 1002 needs to amplify the two RF signals of the carrier frequency $f_r$ for power regeneration and the carrier frequency $f_c$ for data transmission. For that purpose, preferably, the matching circuits 1032 and 1033 are designed to accommodate a frequency range including at least two carrier frequencies $f_r$ and $f_c$. As a configuration of the matching circuit that accommodates such a wide band, a configuration using a transformer element disclosed in Non Patent Literature 2 or a configuration using a transmission line disclosed in Non Patent Literature 3, or the like, for example, may be adopted. Though there are various types of the configuration of the matching circuit, details of the various types of the configuration of the matching circuit do not matter.

Figure 5:
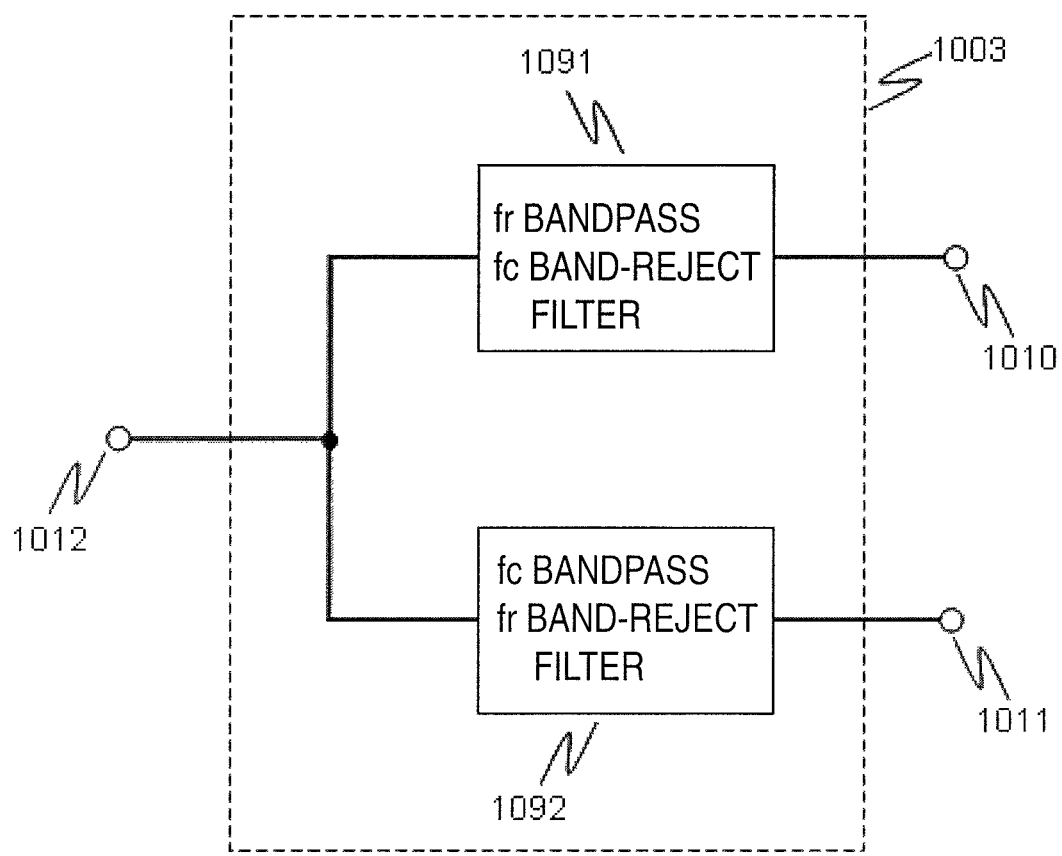
FIG. 5 is a block configuration diagram illustrating a block configuration of a branching filter in the transmission apparatus in the first exemplary embodiment.

FIG. 5 is a block configuration diagram illustrating an example of an internal configuration of the branching filter 1003. The branching filter 1003 comprises at least a filter 1091 that passes the power regenerating RF signal 1021 of the carrier frequency $f_r$ and remove the data transmitting RF signal 1022 of the carrier frequency $f_c$ and a filter 1092 that passes the data transmitting RF signal 1022 of the carrier frequency $f_c$ and remove the power regenerating RF signal 1021 of the carrier frequency $f_r$.

The filter 1091 is installed between an input terminal 1012 of the branching filter 1003 and the terminal 1010 connected to the input to the power regenerator 1005. The filter 1092 is installed between the input terminal 1012 of the branching filter 1003 and the terminal 1011 connected to an input to the transmitting antenna 1006. By the above-mentioned configuration, the data transmitting RF signal 1022 of the carrier frequency $f_c$ is output to the transmitting antenna 1006, and the power regenerating RF signal 1021 of the carrier frequency $f_r$ is output to the power regenerator 1005.

Figure 6:
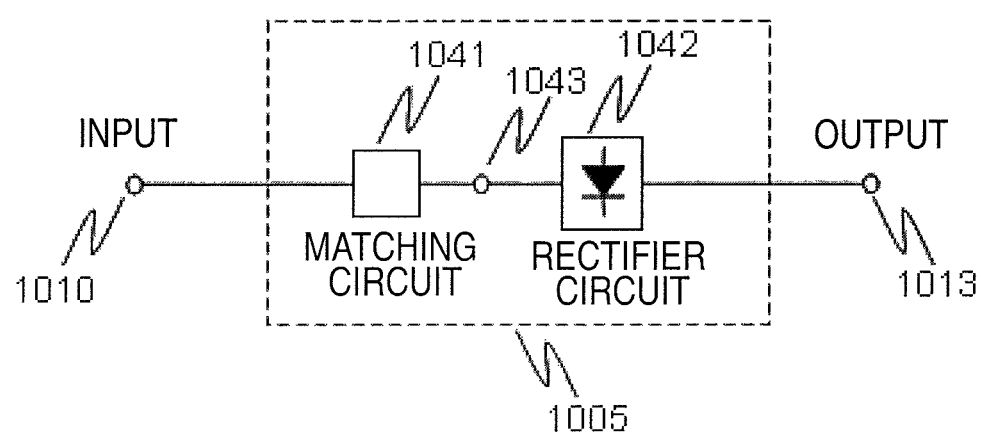
FIG. 6 is a block configuration diagram illustrating a block configuration of a power regenerator in the transmission apparatus in the first exemplary embodiment.

FIG. 6 is a block configuration diagram illustrating an internal configuration of the power regenerator 1005. The power regenerator 1005 includes at least a matching circuit 1041 and a rectifier circuit 1042.

The matching circuit 1041 of the power regenerator 1002 is a circuit that takes impedance matching between an input to the rectifier circuit 1042 and the output of the branching filter 1003, for the carrier frequency $f_r$ of the power regenerating RF signal 1021. The power regenerating RF signal 1021 output from the branching filter 1003 and is then supplied to the terminal 1010 is supplied to the rectifier circuit 1042 through the matching circuit 1041 and a terminal 1043. The power regenerating RF signal 1021 is converted into the low frequency power by the rectifier circuit 1042 to be output to the terminal 1013.

Figure 7:
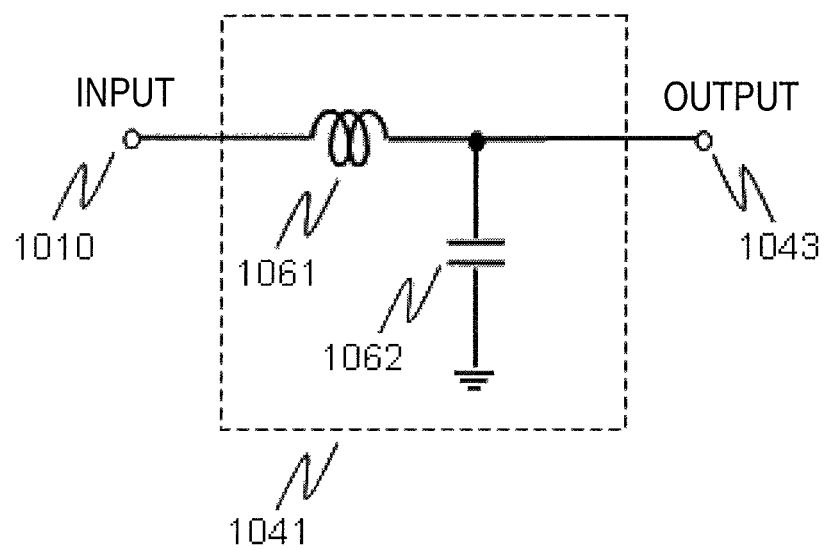
FIG. 7 is a circuit diagram illustrating an example of a circuit configuration of a matching circuit in the power regenerator in the transmission apparatus in the first exemplary embodiment.
Figure 8:
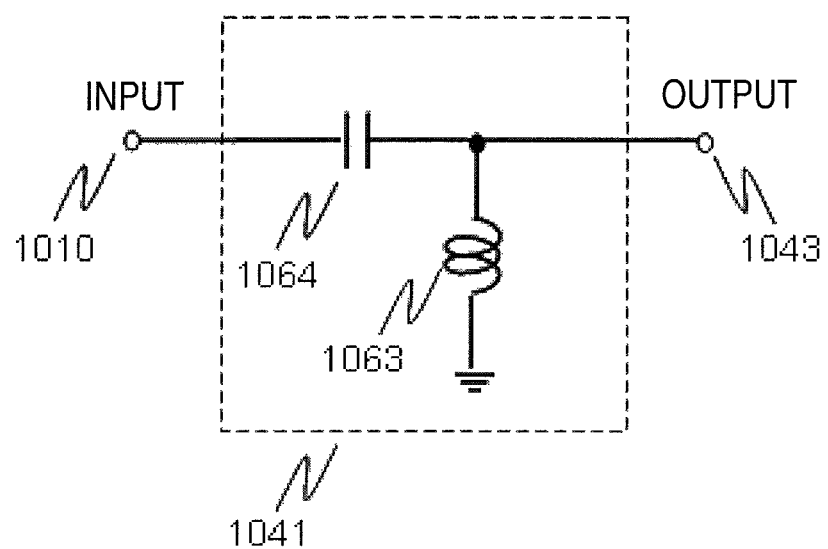
FIG. 8 is a circuit diagram illustrating an example of the circuit configuration of the matching circuit in the power regenerator in the transmission apparatus in the first exemplary embodiment.

FIGS. 7 and 8 are circuit diagrams illustrating an example of an internal configuration of the matching circuit 1041. Matching should be taken for the carrier frequency $f_r$ of the power regenerating RF signal 1021. Thus, the matching circuit 1041 can be implemented by a low-pass filter type circuit constituted from an inductor element 1061 and a capacitance element 1062 as illustrated in FIG. 7 or a high-pass filter type circuit constituted from an inductor element 1063 and a capacitance element 1064 as illustrated in FIG. 8.

Figure 9:
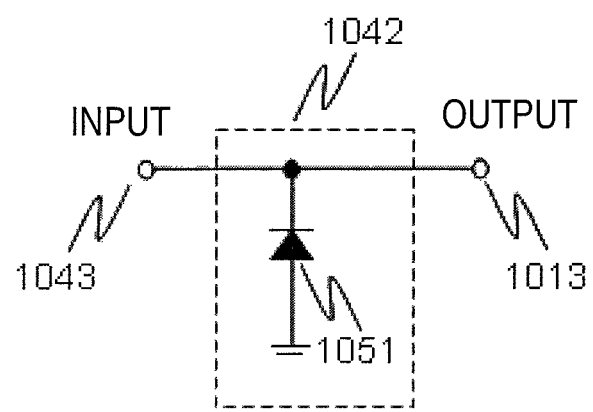
FIG. 9 is a circuit diagram illustrating an example of a circuit configuration of a rectifier circuit in the power regenerator in the transmission apparatus in the first exemplary embodiment.
Figure 10:
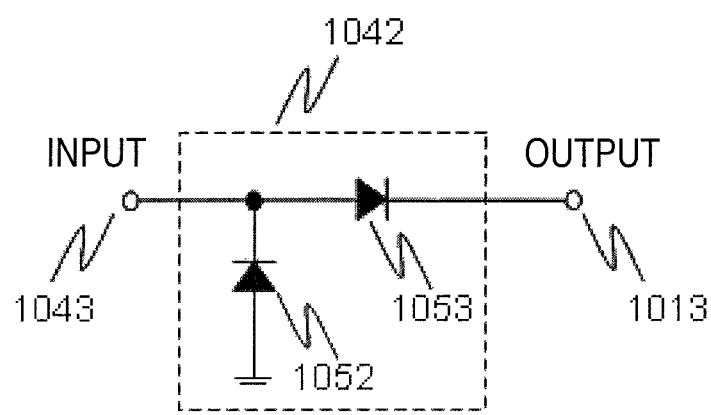
FIG. 10 is a circuit diagram illustrating an example of the circuit configuration of the rectifier circuit in the power regenerator in the transmission apparatus in the first exemplary embodiment.

FIGS. 9 and 10 are circuit diagrams illustrating an example of an internal configuration of the rectifier circuit 1042. The rectifier circuit 1042 may be constituted from a shunt-connected diode element 1051 as illustrated in FIG. 9, or may be constituted from a shunt-connected diode element 1052 and a series-connected diode element 1053 as illustrated in FIG. 10. In the circuit in either of FIGS. 9 and 10, the power regenerating RF signal 1021 supplied to the terminal 1043 is mixed due to quadratic nonlinearity of the diode element 1051 or 1053 to be frequency-converted into the low frequency power. The low frequency power is then output to the terminal 1013.

The diode element 1051 or 1053 of a higher breakdown voltage can be used as the carrier frequency $f_r$ of the power regenerating RF signal 1021 is reduced. Thus, the power regenerator 1005 illustrated in FIGS. 6 to 10 can handle power of a larger level. Accordingly, preferably, the carrier frequency $f_r$ of the power regenerating RF signal 1021 is set to be lower than the carrier frequency $f_c$ of the data transmitting RF signal 1022.

Figure 11:
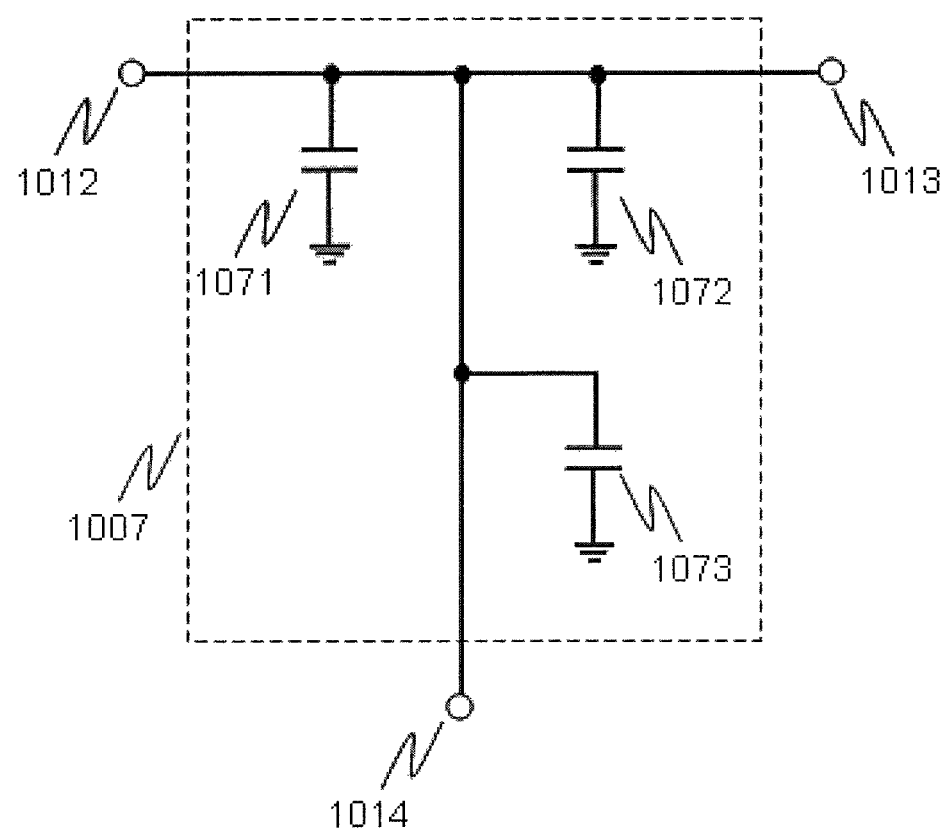
FIG. 11 is a circuit diagram illustrating an example of a circuit configuration of a power combiner in the transmission apparatus in the first exemplary embodiment.

FIG. 11 is a circuit diagram illustrating an example of an internal configuration of the power combiner 1007. The power combiner 1007 may be configured to directly connect three terminals of the terminals 1012 to 1014, as illustrated in FIG. 11. In the configuration in FIG. 11, the terminals 1012 and 1013 corresponding to input terminals are combined in parallel, and a sum of powers supplied to the terminals 1012 and 1013 is output to the terminal 1014. In the configuration in FIG. 11, in order to prevent propagation of high-frequency noise among the three terminals, it is preferable that a capacitance element be shunt-connected to at least one of the terminals 1012 to 1014, as illustrated by capacitance elements 1071 to 1073.

Figure 12:
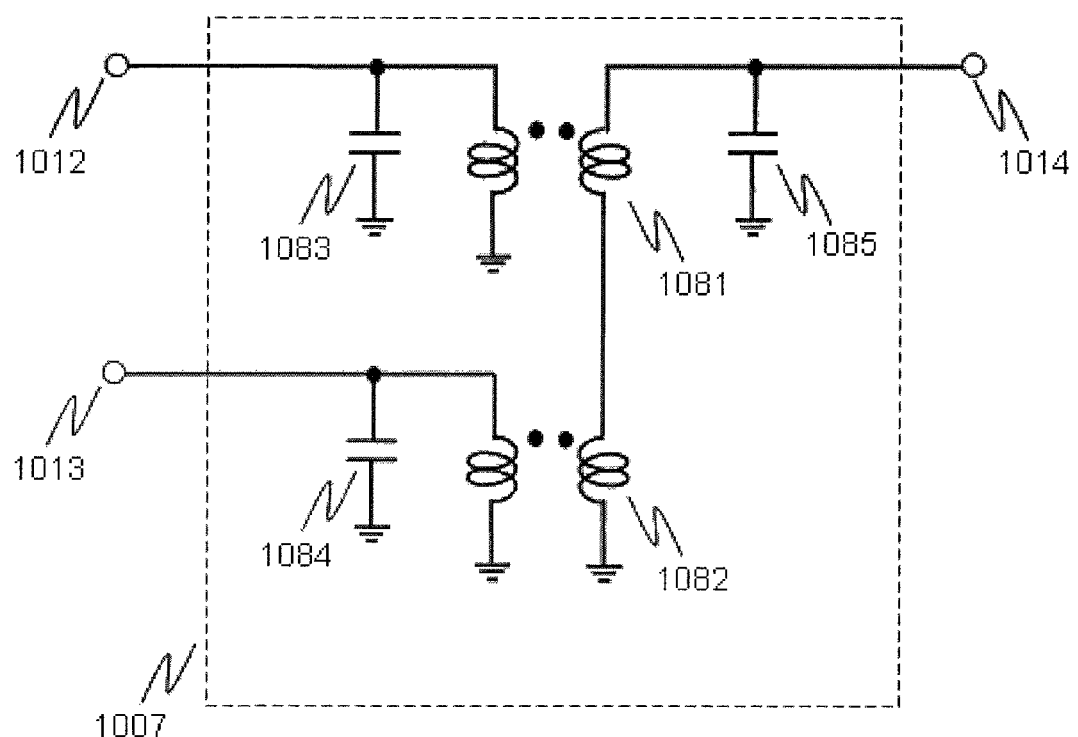
FIG. 12 is a circuit diagram illustrating an example of the circuit configuration of the power combiner in the transmission apparatus in the first exemplary embodiment.

FIG. 12 is a circuit diagram illustrating another example of the internal configuration of the power combiner 1007. As illustrated in FIG. 12, the power combiner 1007 may be so configured that one primary end of a transformer element 1081 is connected to the terminal 1012, one primary end of a transformer element 1082 is connected to the terminal 1013, the other primary end of the transformer elements 1081 and 1082 is grounded, one secondary end of the transformer element 1081 is connected to the terminal 1014, the other secondary end of the transformer element 1081 and secondary one end of the transformer element 1082 are connected, and the other secondary end of the transformer 1082 is grounded. In the configuration in FIG. 12, the terminals 1012 and 1013 corresponding to the input terminals are combined in series, and a sum of powers supplied to the terminals 1012 and 1013 is output to the terminal 1014. In the configuration in FIG. 12, in order to prevent propagation of high-frequency noise among the three terminals of the terminals 1012 to 1014, it is preferable that a capacitance element is shunt-connected to at least one of the terminals 1012 to 1014, as illustrated by capacitance elements 1083 to 1085.

The quantitative effect of power saving in this exemplary embodiment illustrated in FIG. 2 will be disclosed through the following discussion.

Figure 13:
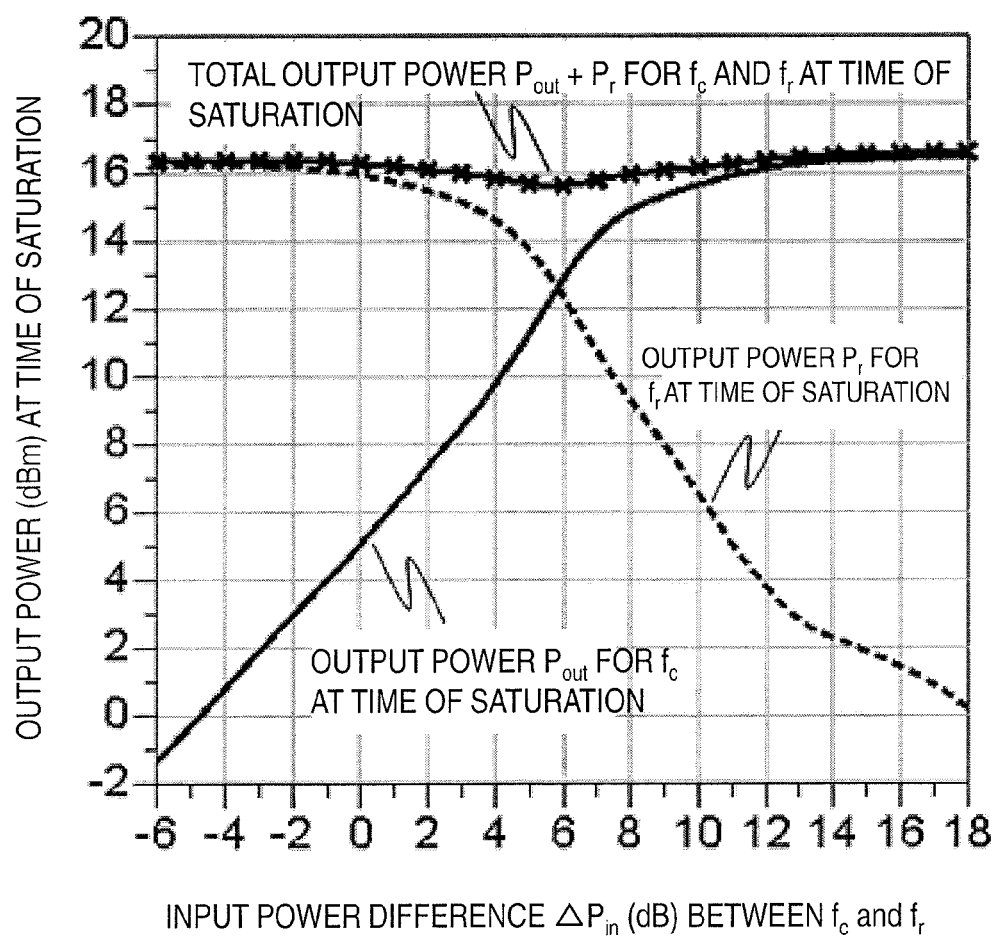
FIG. 13 is a characteristic diagram illustrating input and output power characteristics of output signals at a time of saturation when two RF signals of different carrier frequencies have been simultaneously supplied to a dual band power amplifier (PA) set as an example of the power amplifier in the transmission apparatus in the first exemplary embodiment.

FIG. 13 is a characteristic diagram showing output signals at a time of saturation when two RF signals of different carrier frequencies have been simultaneously supplied to a dual band power amplifier (PA) that is an example of the power amplifier 1002 in FIG. 2. That is, FIG. 13 is a graph plotting power $P_r$ of the power regenerating RF signal 1021 and output power $P_{out}$ of the data transmitting RF signal 1022 at the time of saturation when the dual band power amplifier (PA) that is the example of the power amplifier 1002 in FIG. 2 has simultaneously received the power regenerating RF signal 1123 of the carrier frequency $f_r$ and the data transmitting RF signal 1124 of the carrier frequency $f_c$. In the characteristic diagram in FIG. 13, by varying a power difference $\Delta P_{in} = P_{inr} - P_{inc}$ (dB) between power $P_{inr}$ and power $P_{inc}$ of the power regenerating RF signal 1123 and the data transmitting RF signal 1124 to be supplied to the power amplifier 1002, output power of the power amplifier 1002 at the time of saturation is plotted.

When the power ratio $\Delta P_{in}$ between the respective carrier frequencies to be supplied to the power amplifier 1002 is varied, the power $P_r$ and the power $P_{out}$ of the power regenerating RF signal 1021 and the data transmitting RF signal to be output from the power amplifier 1002 also vary with a change in the ratio. The power amplifier 1002 in this case is so designed that the output power of the power amplifier 1002 at the time of a saturated operation assumes a substantially same value of saturation output power $P_{sat}$ both when the power amplifier 1002 has received the power regenerating RF signal 1123 of the carrier frequency $f_r$ and when the power amplifier 1002 has received the data transmitting RF signal 1124 of the carrier frequency $f_c$.

In the case of the power amplifier as mentioned above whose saturation output power when receiving the single RF signal assumes the same value of $P_{sat}$ irrespective of the carrier frequency, the following result is obtained. That is, even if the power regenerating RF signal 1123 of the carrier frequency $f_r$ and the data transmitting RF signal 1124 of the carrier frequency $f_c$ have been both simultaneously supplied to the power amplifier and the ratio $\Delta P_{in}$ between the input powers has been varied, the value of total output power ($P_{out} + P_r$) of the RF signals at the time of saturation assumes the saturation output power $P_{sat}$ that remains unchanged from the saturation output power when the single RF signal has been supplied. This result indicates that the total value of the output powers of the RF signals determines the saturation condition of the power amplifier (PA), or the power amplifier is saturated when the value of the total output power ($P_{out} + P_r$) of the RF signals reaches the saturation output power $P_{sat}$.

Figure 14:
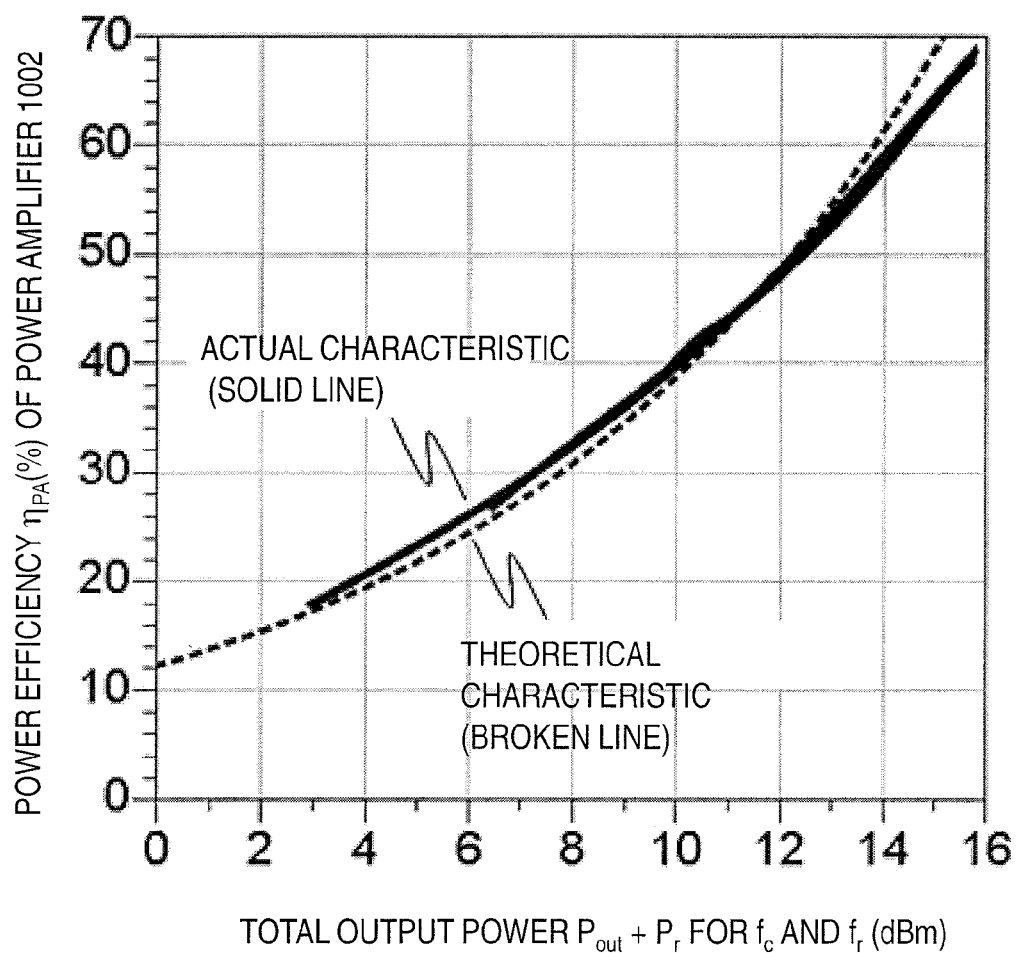
FIG. 14 is a characteristic diagram illustrating a relationship between power efficiency and output power of a dual band power amplifier (PA) when the two RF signals of the different carrier frequencies have been simultaneously supplied to the dual band power amplifier (PA) set as the example of the power amplifier in the transmission apparatus in the first exemplary embodiment.

FIG. 14 is a characteristic diagram showing power efficiency when the two RF signals of the different carrier frequencies have been simultaneously supplied to the dual band power amplifier (PA) that is the example of the power amplifier 1002 in FIG. 2. That is, FIG. 14 is a graph in which power efficiency $\eta_{PA}$ of the dual band power amplifier (PA) that is the example of the power amplifier 1002 in FIG. 2 is plotted when the power regenerating RF signal 1123 of the carrier frequency $f_r$ and the data transmitting RF signal 1124 of the carrier frequency $f_c$ have been simultaneously supplied to the dual band power amplifier (PA). The power efficiency $\eta_{PA}$ in this case is defined by a ratio between power $P_{PA}$ supplied from the power combiner 1007 and then consumed by the power amplifier 1002 and the value of the total output power ($P_{out} + P_r$) of the power $P_r$ and the power $P_{out}$ of the power regenerating RF signal 1021 and the data transmitting RF signal 1022 output from the power amplifier 1002. The power efficiency $\eta_{PA}$ illustrated in FIG. 14 is plotted by varying both of the power $P_r$ of the power regenerating RF signal 1021 and the power $P_{out}$ of the data transmitting RF signal 1022.

It can be seen from the characteristic diagram in FIG. 14 that the power efficiency $\eta_{PA}$ becomes a single-valued function of the total output power ($P_{out} + P_r$) of the RF signals 1021 and 1022 of the respective carrier frequencies, irrespective of setting of the output power $P_r$ and the output power $P_{out}$. It is known that, when an RF signal of one carrier frequency has been supplied to a B-class power amplifier, power efficiency $\eta_{PA}$ of the power amplifier is proportional of the ½th power of output power of the power amplifier. FIG. 9 illustrates a curve that is proportional to the ½th power of the total output power ($P_{out} + P_r$) by a dotted line, as a theoretical characteristic. This characteristic diagram illustrates that the theoretical characteristic matches well with an actual characteristic (indicated by a solid line) with respect to the actual power efficiency $\eta_{PA}$ of the dual band power amplifier (PA) set as the example of the power amplifier 1002 in FIG. 2. That is, even when the RF signals of the carrier frequencies are simultaneously supplied to the power amplifier, the power efficiency $\eta_{PA}$ of the power amplifier is determined by the total value of the output powers of the RF signals, irrespective of a ratio between the respective input powers of the RF signals of the carrier frequencies. Based on the above-mentioned result, the power efficiency $\eta_{PA}$ of the power amplifier 1002 when the two RF signals of the different carrier frequencies have been simultaneously supplied to the power amplifier 1002 can be represented by the following Equation (1):

[Equation 1]

$$\eta_{PA} \equiv \frac{P_{out} + P_r}{P_{PA}} = \eta_{sat} \sqrt{\frac{P_{out} + P_r}{P_{sat}}} \qquad (1)$$

where $\eta_{sat}$ is power efficiency obtained when the power amplifier goes into a saturated state. The output power $P_{sat}$ and the efficiency $\eta_{sat}$ at the time of saturation are intrinsic constants to be determined for each power amplifier. In view of dependency of the power efficiency $\eta_{PA}$ on the output power $P_{out} + P_r$, it can be seen from the Equation (1) that the power efficiency $\eta_{PA}$ becomes maximum to be the efficiency $\eta_{sat}$ at the time of saturation when the power amplifier goes into the saturated state (where $P_{out} + P_r = P_{sat}$).

A temporal variation of power $P_{out}(t)$ of the data transmitting RF signal 1022 is determined by data to be transmitted. Then, in this exemplary embodiment, power $P_r(t)$ of the power regenerating RF signal 1021 to be output from the power amplifier 1002 is so set that the following Equation (2) is satisfied:

[Equation 2]

$$P_r(t) = P_{sat} - P_{out} \qquad (2)$$

Figure 15:
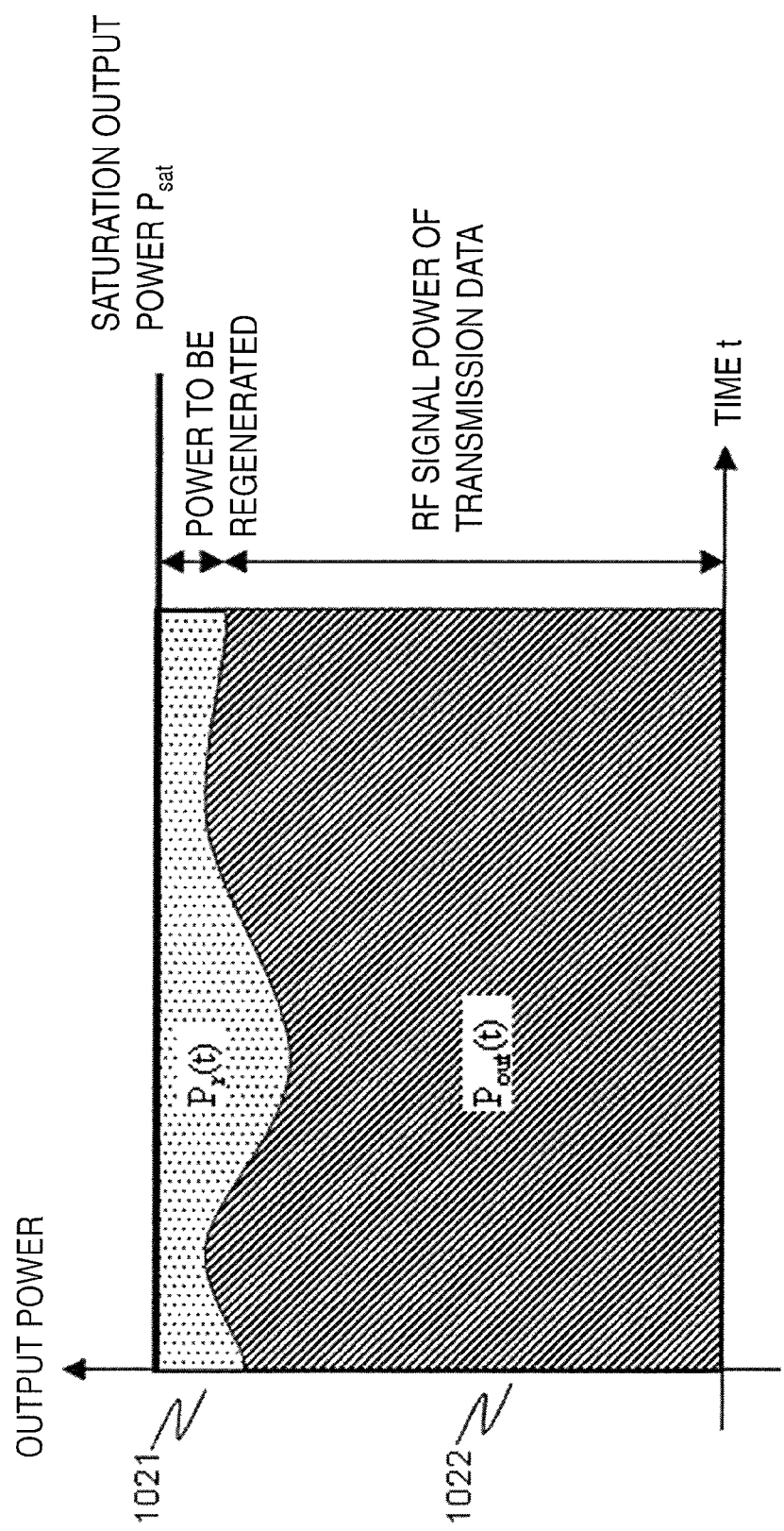
FIG. 15 is a characteristic diagram illustrating an example of a temporal variation of power of a data transmitting RF signal and setting of power of a power regenerating RF signal in the transmission apparatus in the first exemplary embodiment.

Based on setting of a temporal variation of the power of the power regenerating RF signal 1123 to be supplied to the power amplifier 1002, the power $P_r$ (t) of the power regenerating RF signal 1021 is set such that the Equation (2) is satisfied. States of the power $P_r$ (t) of the power regenerating RF signal 1021 and the power $P_{out}$ (t) of the data transmitting RF signal 1022 in the setting that satisfies the condition of the Equation (2) are illustrated as in FIG. 15. Due to the setting that satisfies the condition of the Equation (2), the power amplifier 1002 can constantly operate in the saturated state (where $P_{out}$ (t)+$P_r$ (t)=$P_{sat}$), so that the maximum efficiency ($\eta_{sat}$) can be constantly maintained.

Power $P_{PA}$ (t) to be supplied from the power combiner 1007 and then to be consumed by the power amplifier 1002 in the setting that satisfies the condition of the Equation (2) is computed as expressed in the following Equation (3), based on the Equation (1):

[Equation 3]

$$P_{PA}(t) = P_{sat}/\eta_{sat} \qquad (3)$$

When power efficiency of the power regenerator 1005 is set to be $\eta_r$ ($0<\eta_r<1$) in the transmission apparatus in FIG. 2, power $\eta_r P_r$ (t) is output to the power combiner 1007 from the power regenerator 1005, for the power $P_r$ (t) of the power regenerating RF signal 1021 supplied to the power regenerator 1005.

Power to be consumed by the transmission apparatus in FIG. 2, or power $P_{D(r\_on)}$ (t) to be supplied from the direct-current voltage source 1004 to the power combiner 1007 is given by a difference between the power $P_{PA}=(P_{sat}/\eta_{sat})$ to be output from the power combiner 1007 to the power amplifier 1002 and the power $\eta_r P_r$ (t) to be supplied from the power regenerator 1005 to the power combiner 1007.

Accordingly, the power $P_{D(r\_on)}$ (t) to be consumed by the transmission apparatus in FIG. 2 in the setting that satisfies the condition of the Equation (2) is computed as expressed in the following Equation (4):

[Equation 4]

$$P_{D(r\_on)}(t) = P_{sat}/\eta_{sat} - \eta_r P_r(t) \qquad (4)$$

A discussion will be made about a case where the power $P_r$ (t) of the power regenerating RF signal 1021 to be output from the power amplifier 1002 is set to 0 in the transmission apparatus in FIG. 2, for comparison. The state where the power $P_r$ (t) is set to 0 is readily achieved by implementation of an off state where the power regenerating RF signal of the carrier frequency $f_r$ is not output from the signal generator 1001, as illustrated in FIG. 16.

Figure 16:
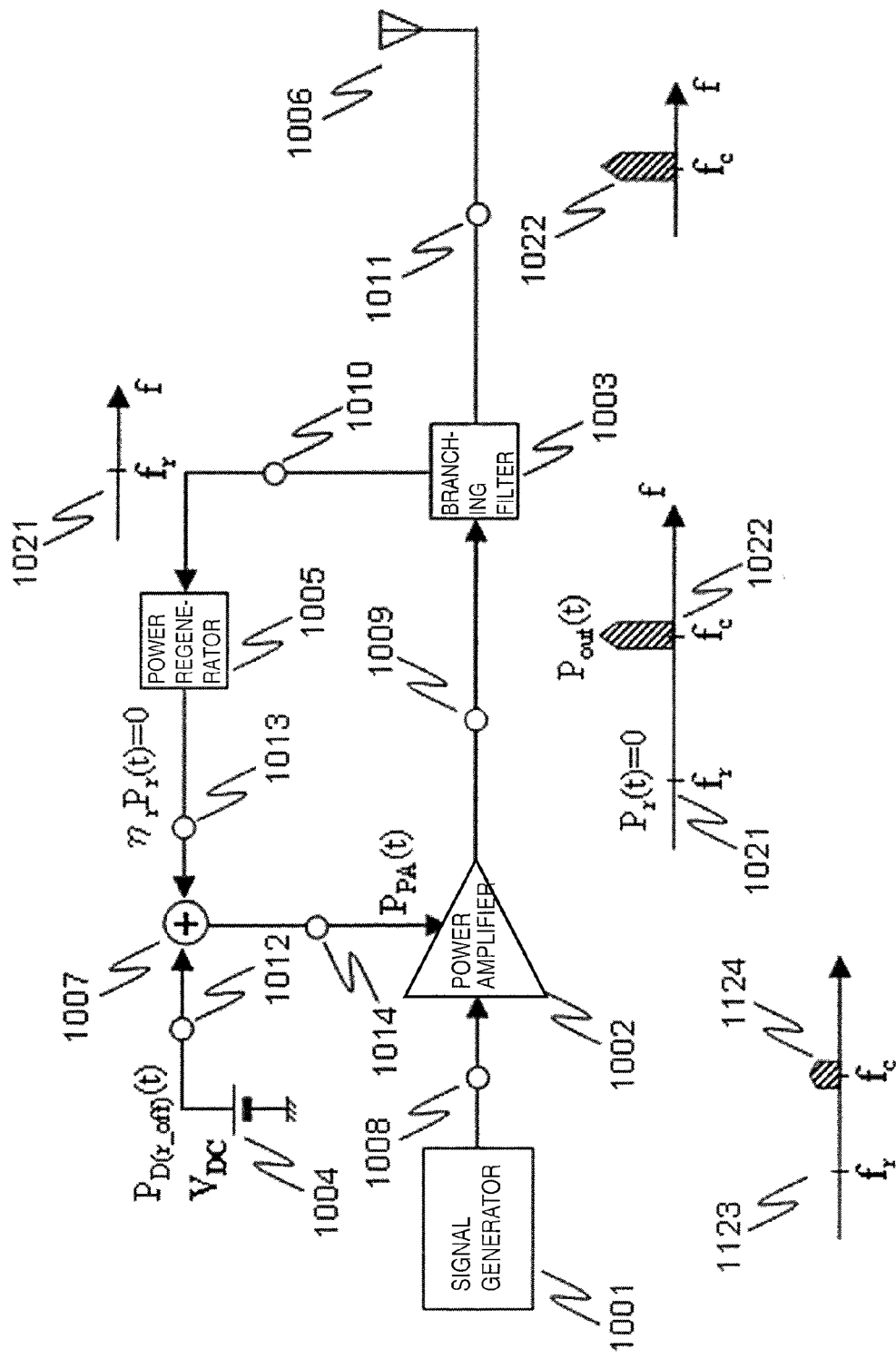
FIG. 16 is a block configuration diagram illustrating a case where the power regenerating RF signal is brought into an off state in the block configuration of the transmission apparatus in the first exemplary embodiment.

In the state of the transmission apparatus illustrated in FIG. 16, the RF signal 1021 to be supplied to the power regenerator 1005 through the branching filter 1003 is brought into the off state, and the power to be output from the power regenerator 1005 to the power combiner 1007 is also turned off. Consequently, the transmission apparatus illustrated in FIG. 16 is in a state equivalent to that of a power amplifier illustrated in FIG. 17 that omits the branching filter 1003, the power regenerator 1005, and the power combiner 1007.

Figure 17:
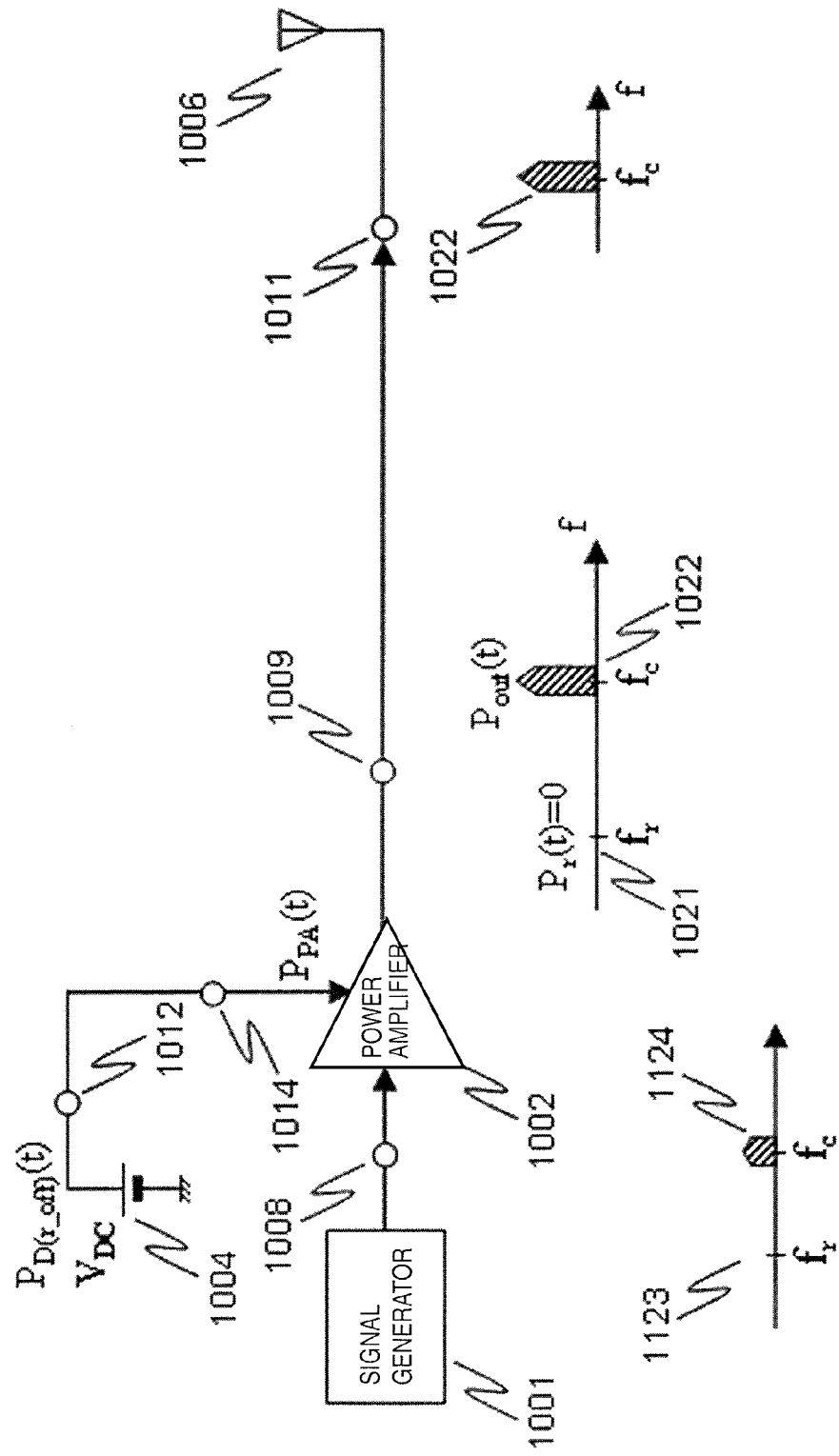
FIG. 17 is a block configuration diagram illustrating a block configuration of the transmission apparatus that does not use the power regenerator.

In the transmission apparatus shown in FIGS. 16 and 17, the power $P_{D(r\_off)}$ (t) to be output from the direct-current power source 1004 becomes equal to the power $P_{PA}$ (t) to be supplied to the power amplifier 1002. Accordingly, the output power $P_{D(r\_off)}$ (t) of the direct-current voltage source 1004 and the power $P_{PA}$ (t) to be supplied to the power amplifier 1002 are computed as expressed in the following Equation (5), using the Equation (1):

[Equation 5]

$$P_{D(r\_off)}(t) = P_{PA}(t) = \sqrt{\frac{P_{sat} P_{out}(t)}{\eta_{sat}}} \qquad (5)$$

In order to compare the power $P_{D(r\_on)}$ (t) to be consumed by the transmission apparatus illustrated in FIG. 2 and the power $P_{D(r\_off)}$ (t) to be consumed by the transmission apparatus illustrated in FIGS. 16 and 17, a ratio between both of the powers of $P_{D(r\_on)}$ (t)/$P_{D(r\_off)}$ (t) is computed. The ratio $P_{D(r\_on)}$ (t)/$P_{D(r\_off)}$ (t) is computed as expressed in the following Equation (6), using the Equations (4) and (5):

[Equation 6]

$$\frac{P_{D(r\_on)}(t)}{P_{D(r\_off)}(t)} = \frac{1 - \eta_{sat} \cdot \eta_r \cdot r_p(t)}{\sqrt{1 - r_p(t)}} \qquad (6)$$

where $r_p$ (t) is a ratio (=$P_r$ (t)/$P_{sat}$) between the power $P_r$ (t) of the power regenerating RF signal 1021 and the saturation output $P_{sat}$ in the transmission apparatus in FIG. 2. When the ratio $P_{D(r\_on)}$ (t)/$P_{D(r\_off)}$ (t) (t) is not more than 1, it means that the power $P_{D(r\_on)}$ (t) to be consumed by the transmission apparatus in this exemplary embodiment is smaller than the power $P_{D(r\_off)}$ (t), so that power saving of the transmission apparatus in this exemplary embodiment is thereby demonstrated.

Figure 18:
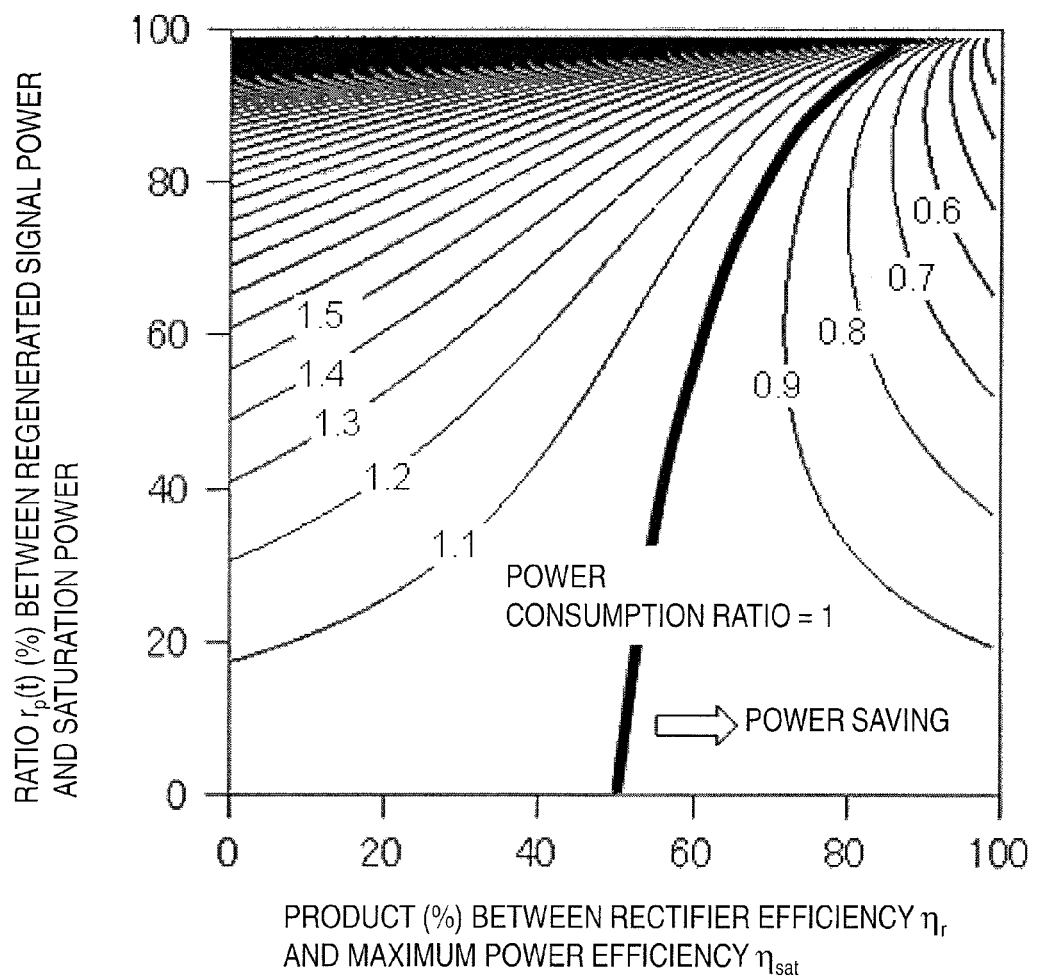
FIG. 18 is a characteristic diagram illustrating comparison between power consumption when the power regenerator is used and power consumption when the power regenerator is not used, in the transmission apparatus in the first exemplary embodiment.

FIG. 18 is a characteristic diagram showing comparison of power consumptions between when the power regenerator is used in the transmission apparatus in this exemplary embodiment and when the power regenerator is not used in the transmission apparatus in this exemplary embodiment. Referring to FIG. 18, the power ratio $r_p$ (t) between the power regenerating RF signal 1021 and the saturation output of the power amplifier 1002 is plotted on a vertical axis, and a product $\eta_{sat}\eta_r$ between power efficiency of the power regenerator 1005 and the maximum efficiency of the power amplifier 1002 is plotted on a horizontal axis. The power ratio $P_{D(r\_on)}$ (t)/$P_{D(r\_off)}$ (t) computed by the Equation (6) is plotted in the form of contour lines. The result in FIG. 18 shows that, when the product $\eta_{sat}\eta_r$ between the power efficiency of the power regenerator 1005 and the maximum efficiency of the power amplifier 1002 plotted on the horizontal axis is large (equal to or higher than 50% in particular) and when the power ratio $r_p$ (t) between the power regenerating RF signal 1021 and the saturation output of the power amplifier 1002 is small, the ratio $P_{D(r\_on)}$ (t)/$P_{D(r\_off)}$ (t) becomes no more than 1, so that power saving of the transmission apparatus in this exemplary embodiment can be implemented.

Current technology can achieve both of 80% of the maximum efficiency $\eta_{sat}$ of the power amplifier 1002 and 80% of the power efficiency $\eta_r$ of the power regenerator 1005, so that the current technology can achieve 64% of the product $\eta_{sat}\eta_r$ between both of the efficiencies. Assume that the product $\eta_{sat}\eta_r$ between both of the efficiencies is 64% as an example. Then, power saving by the use of the power regenerating RF signal 1021 in this exemplary embodiment becomes possible when the power ratio $r_p$ (t) is equal to or less than 0.8.

Second Exemplary Embodiment

Next, a second exemplary embodiment will be described in detail, using the drawings.

Figure 19:
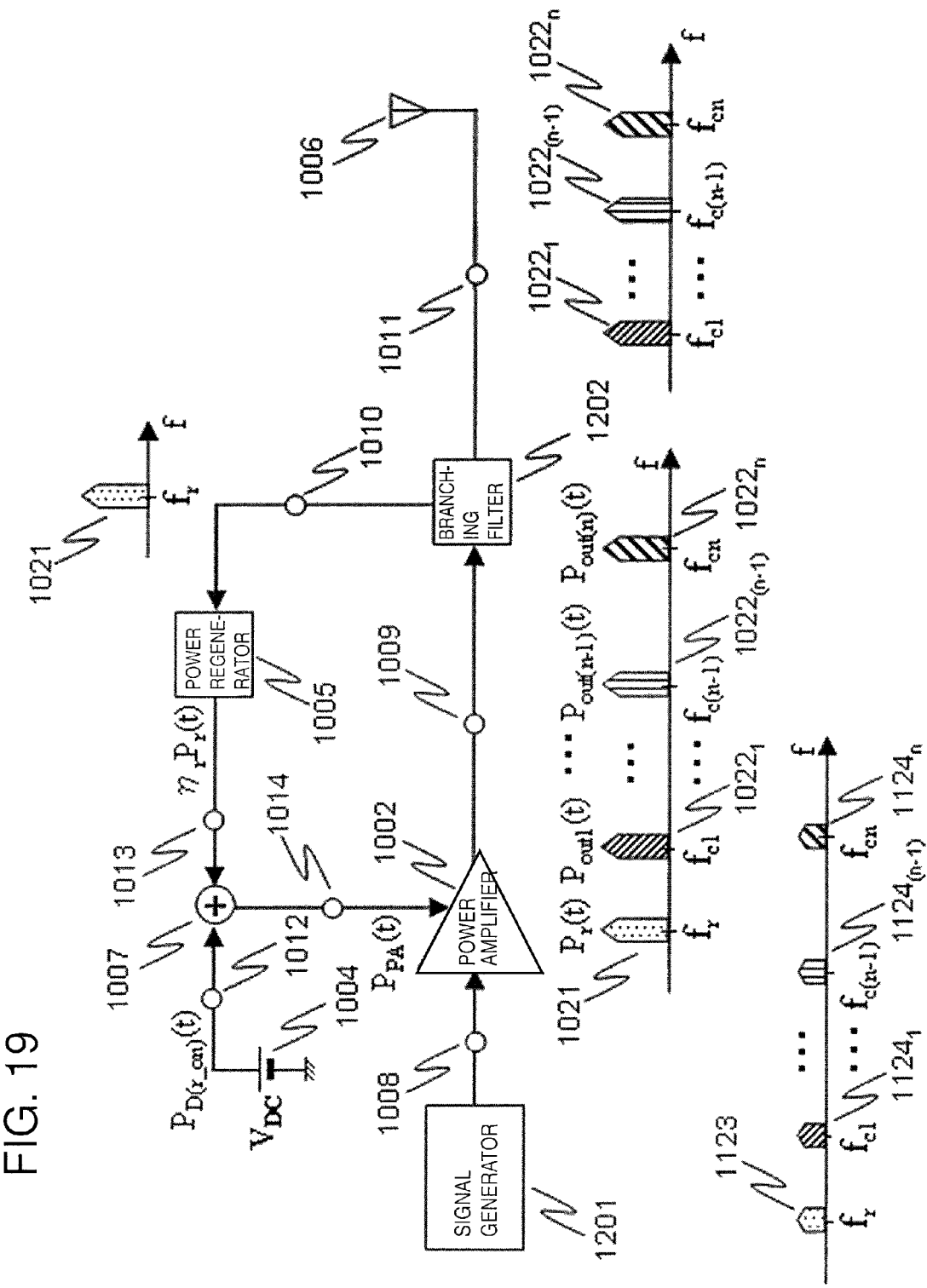
FIG. 19 is a block configuration diagram illustrating a block configuration of a transmission apparatus according to a second exemplary embodiment.

FIG. 19 is a block configuration diagram illustrating a block configuration of a transmission apparatus according to the second exemplary embodiment. The transmission apparatus according to the second exemplary embodiment illustrated in FIG. 19 has the same function and configuration as the transmission apparatus according to the first exemplary embodiment illustrated in FIG. 2, except that the number of bands of the data transmission RF signal is plural rather than one.

A signal generator 1201 in the transmission apparatus according to the second exemplary embodiment estimates the total of amplified powers as total amplified power, based on the power amplification factor of a power amplifier 1002. Then, the signal generator 1201 controls an output of the signal generator 1201, according to the total amplified power.

The transmission apparatus according to the second exemplary embodiment illustrated in FIG. 19 simultaneously outputs data transmitting RF signals $1124_1, \ldots, 1124_{(n-1)}$, and $1124_n$ of a plurality of carrier frequencies $f_{c1}, \ldots, f_{c(n-1)}$, and $f_{cn}$ and a power regenerating RF signal 1123 of a carrier frequency $f_r$ from the signal generator 1201 to the power amplifier 1002. The power amplifier 1002 amplifies the supplied RF signals to output data transmitting RF signals $1022_1, \ldots, 1022_{(n-1)}$, and $1022_n$ of the carrier frequencies $f_{ci}$ and a power regenerating RF signal 1021 of the carrier frequency $f_r$ to a branching filter 1202. The branching filter 1202 outputs the data transmitting RF signals $1022_1, \ldots, 1022_{(n-1)}$, and $1022_n$ of the carrier frequencies $f_{c1}$ to $f_{cn}$ to a transmitting antenna 1006 through a terminal 1011, and outputs the power regenerating RF signal 1021 of the carrier frequency $f_r$ to a power regenerator 1005. As in the first exemplary embodiment, the power regenerating RF signal 1021 is converted into low frequency power at a power regenerator 1005 to be reused as power to be supplied to the power amplifier 1002, in the second exemplary embodiment as well.

The carrier frequencies $f_{c1}, \ldots, f_{c(n-1)}$, and $f_{cn}$ of the data transmitting RF signals $1124_1, \ldots, 1124_{(n-1)}$, and $1124_n$ in this exemplary embodiment are set according to a communication standard to be used. On the other hand, the carrier frequency $f_r$ may be arbitrarily set.

As in the first exemplary embodiment, the lower the carrier frequency $f_r$ of the power regenerating RF signal 1021 is, the larger power the power regenerator 1005 can handle, in the second exemplary embodiment as well. Accordingly, it is desirable that the carrier frequency $f_r$ of the power regenerating RF signal 1021 be set to be lower than the carrier frequencies $f_{c1}, \ldots, f_{c(n-1)}$, and $f_{cn}$ of the data transmitting RF signals $1022_1, \ldots, 1022_{(n-1)}$, and $1022_n$.

Figure 20:
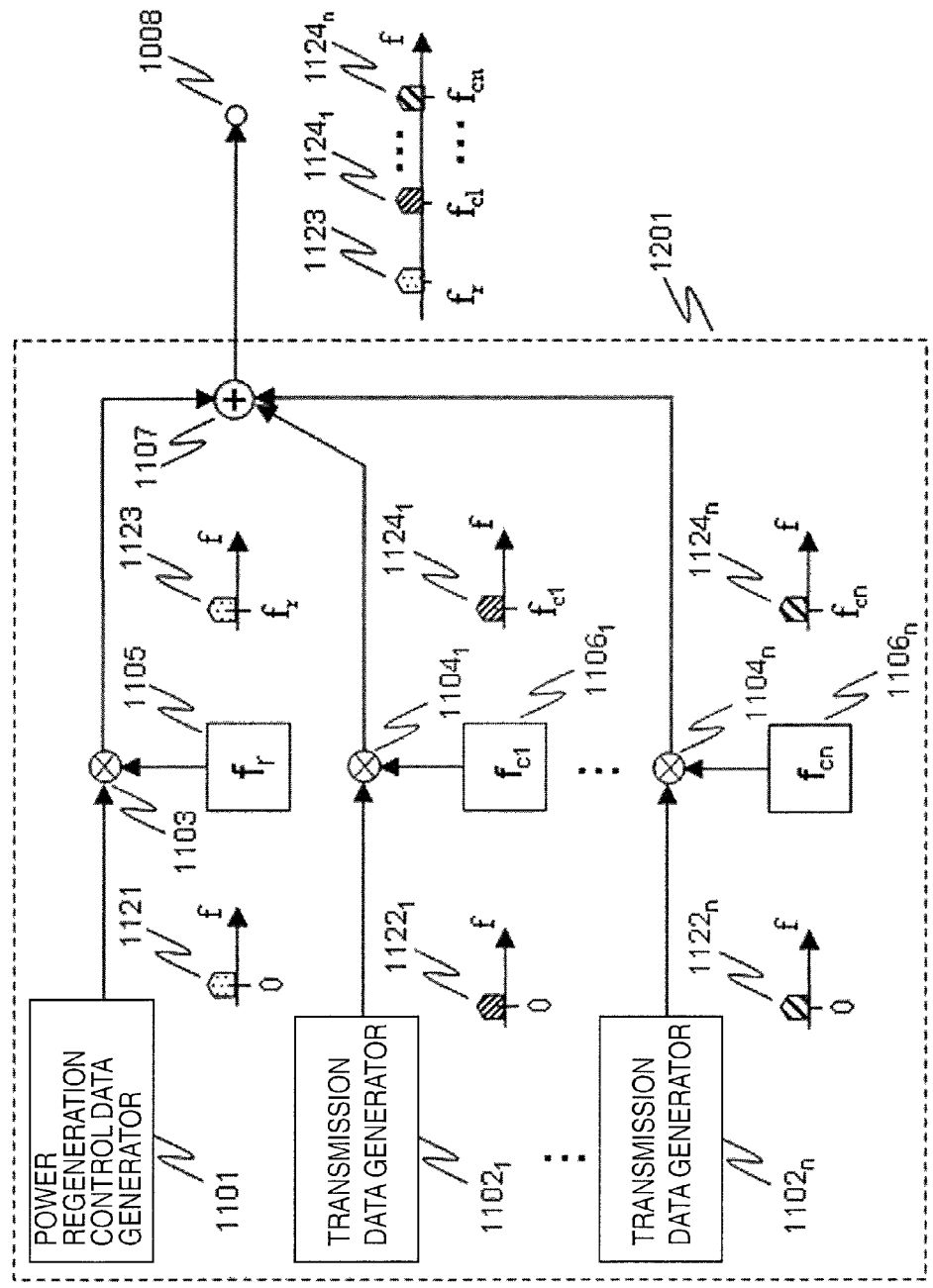
FIG. 20 is a block configuration diagram illustrating a block configuration of a signal generator in the transmission apparatus in the second exemplary embodiment.

The signal generator 1201 in the transmission apparatus according to the second exemplary embodiment illustrated in FIG. 19 outputs the data transmitting RF signals $1124_1, \ldots, 1124_{(n-1)}$, and $1124_n$ that are plural. In order to implement the above-mentioned function, the signal generator 1201 has an internal configuration disclosed in FIG. 20 as an example. The signal generator 1201 illustrated in FIG. 20 comprises transmission data generators $1102_1, \ldots, 1102_{(n-1)}$, and $1102_n$ being equal in number to the bands to be used for data transmission, mixers $1104_1, \ldots, 1104_{(n-1)}$, and $1104_n$ being equal to the bands to be used for data transmission, and LO signal generators $1106_1, \ldots, 1106_{(n-1)}$, and $1106_n$ being equal in number to the bands to be used for data transmission.

The transmission data generators $1102_1, \ldots, 1102_{(n-1)}$, and $1102_n$ in the signal generator 1201 respectively output data transmitting baseband signals $1122_1, \ldots, 1122_{(n-1)}$, and $1122_n$ to the mixers $1104_1, \ldots, 1104_{(n-1)}$.

The LO signal generators $1106_1, \ldots, 1106_{(n-1)}$, and $1106_n$ respectively output data transmitting LO signals of the carrier frequencies $f_{c1}, \ldots, f_{c(n-1)}$, and $f_{cn}$ to the mixers $1104_1, \ldots, 1104_{(n-1)}$, and $1104_n$. At the mixers $1104_1, \ldots, 1104_{(n-1)}$, and $1104_n$, the data transmitting baseband signals $1122_1, \ldots, 1122_{(n-1)}$, and $1122_n$ are respectively mixed with the data transmitting LO signals of the carrier frequencies $f_{c1}, \ldots, f_{c(n-1)}$, and $f_{cn}$. Then, the data transmitting RF signals $1124_1, \ldots, 1124_{(n-1)}$, and $1124_n$ of the carrier frequencies $f_{c1}, \ldots, f_{c(n-1)}$, and $f_{cn}$ are output to an RF signal combiner 1107.

The RF signal combiner 1107 combines the power regenerating RF signal 1123 and the data transmitting RF signals $1124_1, \ldots, 1124_{(n-1)}$, and $1124_n$ that have been supplied to the RF signal combiner 1107, for output to a terminal 1014.

Figure 21:
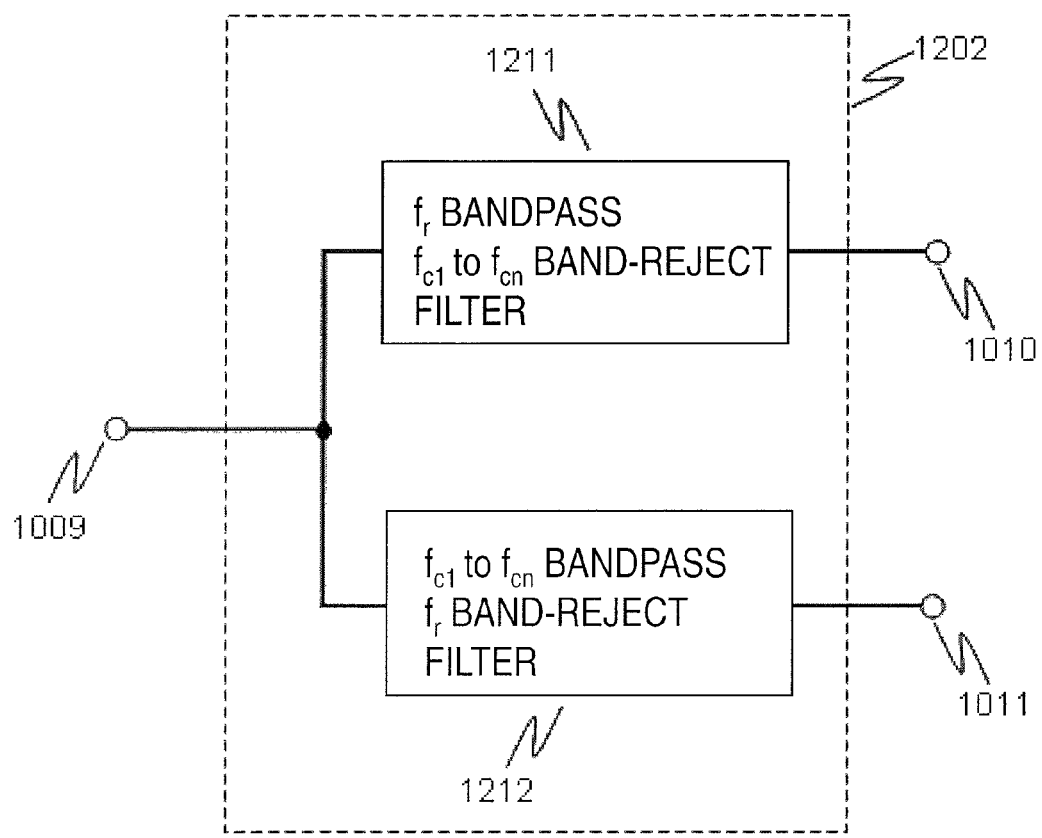
FIG. 21 is a block configuration diagram illustrating a block configuration of a branching filter in the transmission apparatus in the second exemplary embodiment.

The branching filter 1202 in the transmission apparatus according to the second exemplary embodiment illustrated in FIG. 19 has an internal configuration disclosed in a block configuration diagram in FIG. 21, as an example. The branching filter 1202 illustrated in FIG. 21 has the configuration in which a filter 1211 is installed between a terminal 1009 and the terminal 1010 and a filter 1212 is installed between the terminal 1009 and the terminal 1011. The filter 1211 passes the RF signal of the carrier frequency $f_r$ and shut off the RF signals of the carrier frequencies $f_{c1}, \ldots, f_{c(n-1)}$, and $f_{cn}$. The filter 1212 shuts off the RF signal of the carrier frequency $f_r$ and pass the RF signals of the carrier frequencies $f_{c1}, \ldots, f_{c(n-1)}$, and $f_{cn}$. With the above-mentioned configuration, a function of outputting the data transmitting RF signals $1022_1, \ldots, 1022_{(n-1)}$, and $1022_n$ of the carrier frequencies $f_{c1}, \ldots, f_{c(n-1)}$, and $f_{cn}$ to the terminal 1011 and outputting the power regenerating RF signal 1021 of the carrier frequency $f_r$ to the terminal 1010 with respect to the RF signals that have been supplied through the terminal 1009 is implemented by the branching filter 1202.

The signal generator 1201 may determine whether or not to output the power regenerating RF signal of the carrier frequency $f_r$ according to a result of comparison between the above-mentioned total amplified power and predetermined reference power.

Figure 22:
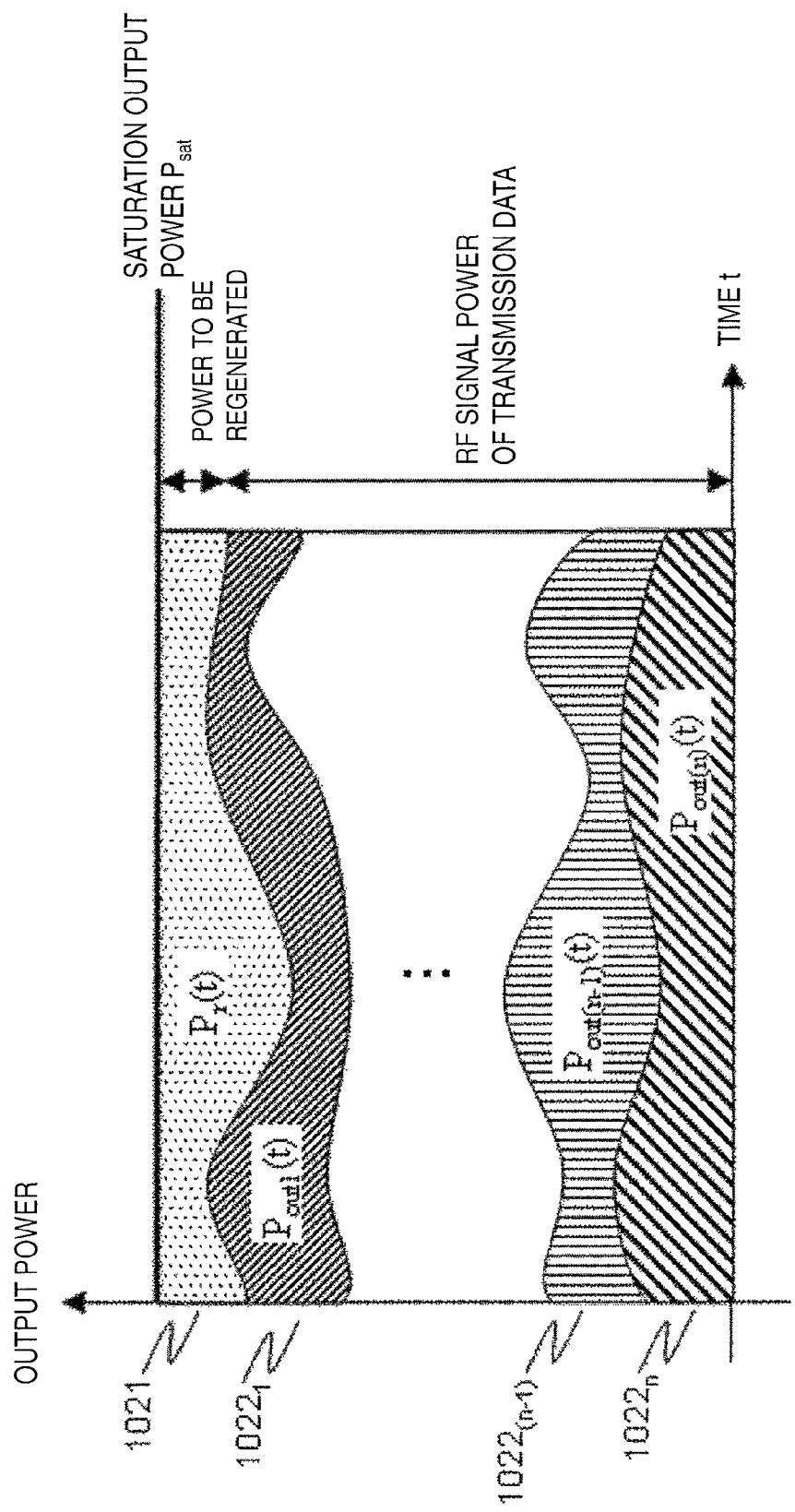
FIG. 22 is a characteristic diagram illustrating an example of temporal variations of powers of data transmitting RF signals and setting of power of a power regenerating RF signal in the transmission apparatus in the second exemplary embodiment.

FIG. 22 is a diagram illustrating an example of temporal variations of powers $P_{OUT1}(t), \ldots, P_{OUT(n-1)}(t)$, and $P_{OUT(n)}(t)$ and power $P_r(t)$ of the data transmitting RF signals $1022_1, \ldots, 1022_{(n-1)}$, and $1022_n$ and the power regenerating RF signal 1021 output from the power amplifier 1002. The temporal variations of the powers $P_{OUT1}(t), \ldots, P_{OUT(n-1)}(t)$, and $P_{OUT\ (n)}(t)$ of the data transmitting RF signals $1022_1, \ldots, 1022_{(n-1)}$, and $1022_n$ are determined by data to be transmitted. Then, in this exemplary embodiment, the power $P_r(t)$ of the power regenerating RF signal 1021 to be output from the power amplifier 1002 is determined such that the following Equation (7) is satisfied:

[Equation 7]

$$P_r(t) = P_{sat} - [P_{out1}(t) + \ldots + P_{out(n-1)}(t) + P_{out(n)}(t)] \quad (7)$$

Based on setting of a temporal variation of power of the power regenerating RF signal 1123 to be supplied to the power amplifier 1002, the power $P_r(t)$ of the power regenerating RF signal 1021 is set such that the Equation (7) is satisfied. Due to the setting that satisfies the condition of the Equation (7), the power amplifier 1002 constantly operates in a saturated state (where $P_{out1}(t) + \ldots + P_{OUT\ (n-1)}(t) + POUT_{(n)}(t) + P_r(t) = P_{sat}$), so that a maximum efficiency ($\eta_{sat}$) can be constantly maintained.

In order to compare power $P_{D(r\_on)}$ (t) to be consumed by the transmission apparatus in the second exemplary embodiment illustrated in FIG. 19 and power $P_{D(r\_off)}$ (t) to be consumed by the transmission apparatus illustrated in FIGS. 16 and 17, a ratio between both of the powers of $P_{D(r\_on)}$ (t)/$P_{D(r\_off)}$ (t) is computed. The ratio $P_{D(r\_on)}$ (t)/$P_{D(r\_off)}$ (t) in the second exemplary embodiment is given by the Equation (6), as in the first exemplary embodiment. Accordingly, a relationship among a power ratio $r_p$ (t) between the power regenerating RF signal 1021 and the saturation output of the power amplifier 1002, a product $\eta_{sat}\eta_r$ between power efficiency of the power regenerator 1005 and the maximum efficiency of the power amplifier 1002, the power consumption ratio $P_{D(r\_on)}$ (t)/$P_{D(r\_off)}$ (t) is illustrated by FIG. 18 in both of the first and second exemplary embodiments. In view of the above-mentioned discussion, power saving of the transmission apparatus in the second exemplary embodiment can be implemented also in the second exemplary embodiment, as in the first exemplary embodiment.

The signal generator 1201 may output a signal whose total amplified power described above is the predetermined reference power.

Figure 23:
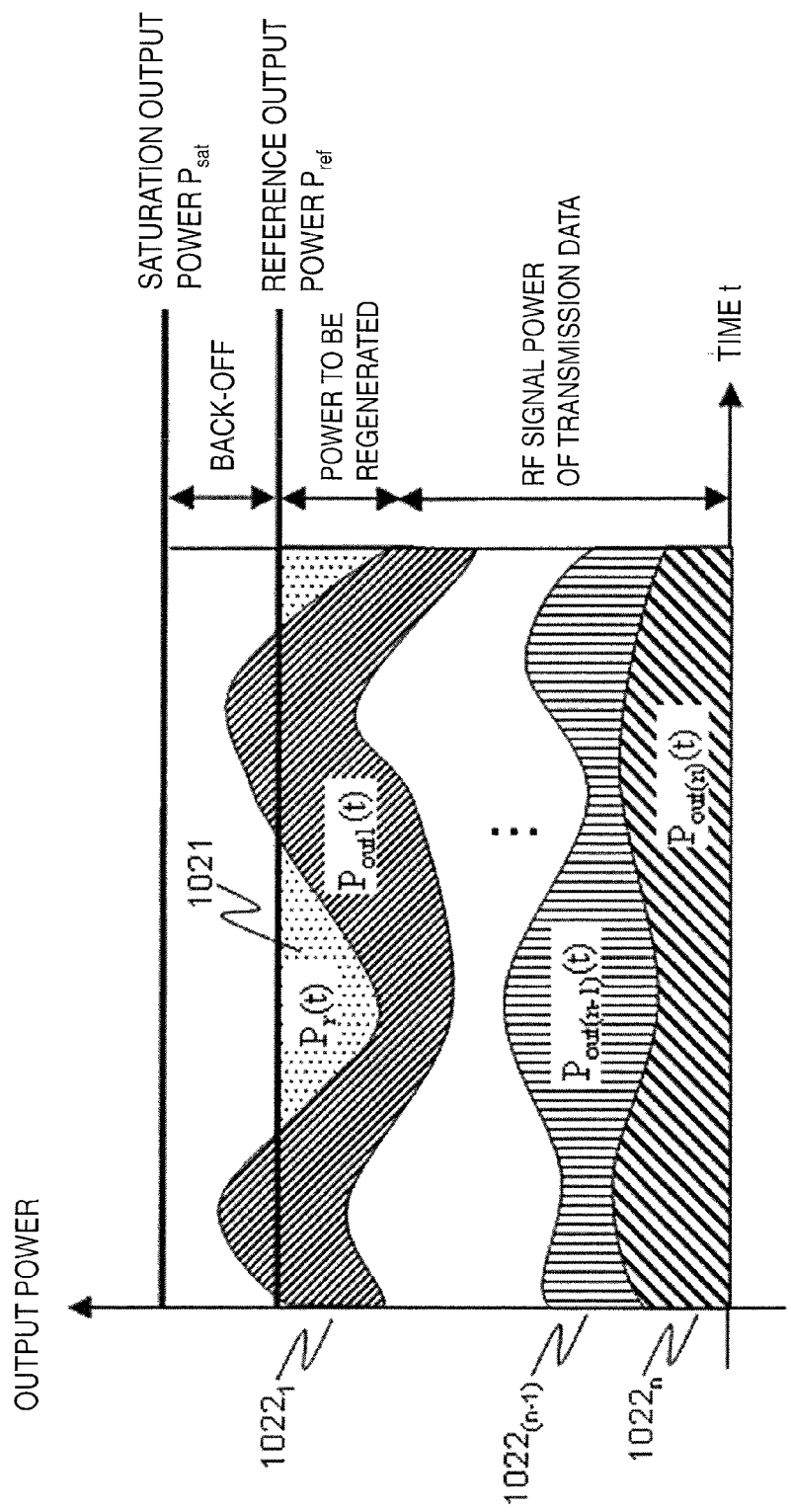
FIG. 23 is a characteristic diagram illustrating an example of temporal variations of power of the data transmitting RF signals and setting of power of the power regenerating RF signal in the transmission apparatus in the second exemplary embodiment.

Specifically, an example of temporal variations of the powers $P_{OUT1}$ (t), ..., $P_{OUT(n-1)}$ (t), and $P_{OUT(n)}$ (t) and the power $P_r$ (t) of the data transmitting RF signals $1022_1$, ..., $1022_{(n-1)}$, and $1022_n$ and the power regenerating RF signal 1021 output from the power amplifier 1002 may be set, as in FIG. 23. Referring to FIG. 23, reference output power $P_{ref}$ obtained by removing a back-off amount from saturation output power $P_{sat}$ is set. Then, when the total value of the powers $P_{OUT1}$ (t), ..., $P_{OUT(n-1)}$ (t), and $P_{OUT(n)}$ (t) of the data transmitting RF signals $1022_1$, ..., $1022_{(n-1)}$, and $1022_n$ is smaller than the reference output power $P_{ref}$, the power $P_r$ (t) of the power regenerating RF signal 1021 is set as expressed in the following Equation (8):

[Equation 8]

$$P_r(t) = P_{ref} [P_{out1}(t) + \ldots + P_{out(n-1)}(t) + P_{out(n)}(t)] \quad (8)$$

When the total value of the powers $P_{OUT1}$ (t), ..., $P_{OUT(n-1)}$ (t), and $P_{OUT(n)}$ (t) of the data transmitting RF signals $1022_1$, ..., $1022_{(n-1)}$, and $1022_n$ is equal to or larger than the reference output power $P_{ref}$, the power $P_r$ (t) of the power regenerating RF signal 1021 is set to be 0. A number n of the bands of the data transmitting RF signals $1022_1$, ..., $1022_{(n-1)}$, and $1022_n$ may be one or plural.

In the case of the setting given by the Equation (8), the total value of the powers of the RF signals to be output from the power amplifier 1002 becomes $P_{ref}$ and is set to be lower than the saturation output $P_{sat}$. By setting the total value of the powers to be output from the power amplifier 1002 to be lower than the saturation output $P_{sat}$, the power amplifier 1002 can be avoided from operating in the vicinity of the saturation output power that exhibits a strong nonlinear characteristic. A signal distortion that may be produced at the data transmitting RF signals $1022_1$, ..., $1022_{(n-1)}$, and $1022_n$ can be thereby reduced.

Third Exemplary Embodiment

Next, a third exemplary embodiment will be described in detail, using the drawings.

Figure 24:
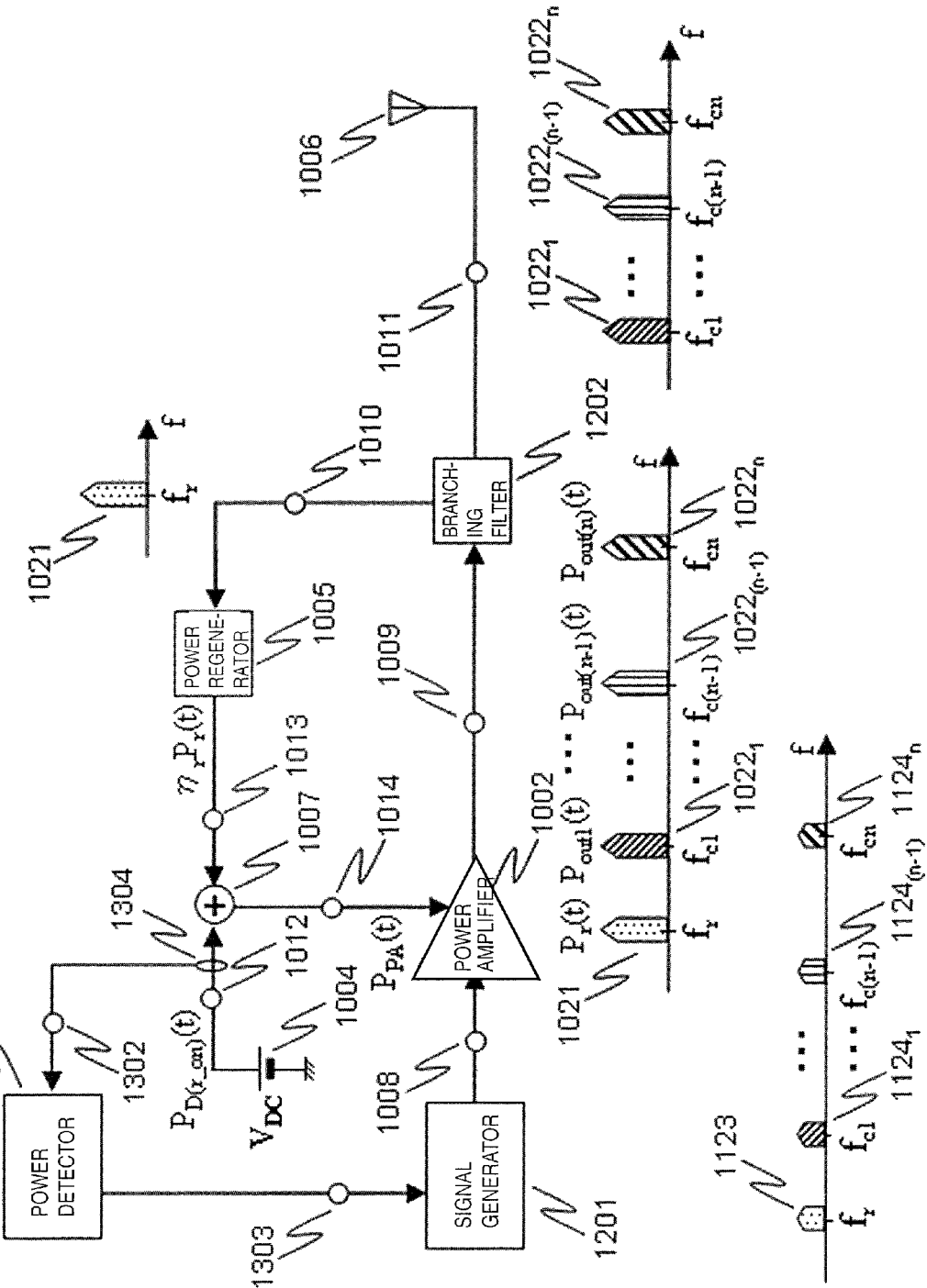
FIG. 24 is a block configuration diagram illustrating a block configuration of a transmission apparatus according to a third exemplary embodiment.

FIG. 24 is a block configuration diagram illustrating a block configuration of a transmission apparatus according to a third exemplary embodiment. The transmission apparatus according to the third exemplary embodiment illustrated in FIG. 24 is obtained by adding a power detector 1301 and a current probe 1304 to the transmission apparatus according to the second exemplary embodiment illustrated in FIG. 19.

The current probe 1304 measures an amount of current output to a terminal 1012 by a direct-current voltage source 1004. The current probe 1304 may be a probe of a type that includes a Hall element and to measure the current amount by using the Hall effect, or a probe of a type in which a resistance element is inserted in series between the direct-current voltage source 1004 and the terminal 1012 and that measures the current amount based on a ratio between a voltage value and a resistance value of the resistance element. Information on the amount of current output from the direct-current voltage source 1004 and measured by the current probe 1304 is transmitted to the power detector 1301 through a terminal 1302.

The power detector 1301 is implemented by a microcontroller (microcontroller) and has a function of computing a power amount $P_{D(r\_on)}$ (t) from a product between the current amount and a direct-current voltage $V_{DC}$ output by the direct-current voltage source 1004. The power detector 1301 performs control over a signal generator 1201 through a terminal 1303, based on information on the power amount $P_{D(r\_on)}$ (t).

As an example of the control over the signal generator 1201 to be performed by the power detector 1301, setting of a carrier frequency $f_r$ is provided. In the third exemplary embodiment as well, the carrier frequency $f_r$ may be arbitrarily set, without being set by a communication standard as in the first and second exemplary embodiments. Then, in the third exemplary embodiment, the current probe 1304 and the power detector 1301 measure an output power amount $P_{D(r\_on)}$ (t) of the direct-current voltage source 1004 when the carrier frequency $f_r$ of a power regenerating RF signal 1123 is varied. Then, the signal generator 1201 determines the carrier frequency $f_r$, based on a result of detection by the power detector 1301.

Specifically, the carrier frequency $f_r$ of the power regenerating RF signal 1123 to be output by the signal generator 1201 is set to a frequency that minimizes the output power amount $P_{D(r\_on)}$ (t) of the direct-current voltage source 1004. The carrier frequency $f_r$ of the power regenerating RF signal 1123 is changed by changing the oscillation frequency of an LO signal generator 1105 in FIG. 20. The oscillation frequency of the LO signal generator 1105 can be changed and controlled by implementing the LO signal generator 1105 by a synthesizer, for example. Accordingly, power saving of the transmission apparatus is implemented by the control over the signal generator 1201 by the power detector 1301.

As another example of the control over the signal generator 1201 to be performed by the power detector 1301, on/off control over the power regenerating RF signal 1123 is provided. That is, the signal generator 1201 determines whether or not to output the carrier frequency $f_r$, based on the result of detection by the power detector 1301.

As illustrated in the characteristic diagram in FIG. 18, a magnitude relation between the power $P_{D(r\_on)}$ (t) to be consumed by the transmission apparatus when a power regenerating RF signal 1021 is used and power $P_{D(r\_off)}$ (t) to be consumed by the transmission apparatus when the power regenerating RF signal 1021 is not used varies according to the condition.

Then, the power $P_{D(r\_on)}$ (t) consumed by the transmission apparatus when the power regenerating RF signal 1021 has been output from the signal generator 1201 and the power $P_{D(r\_off)}$ (t) consumed by the transmission apparatus when the power regenerating RF signal 1021 is not output from the signal generator 1201 are measured by the current probe 1304 and the power detector 1301, with powers $P_{OUT1}$ (t), ..., $P_{OUT(n-1)}$ (t), and $P_{OUT(n)}$ (t) of data transmitting RF signals $1022_1, \ldots, 1022_{(n-1)}$, and $1022_n$ and power $P_r(t)$ of the power regenerating RF signal 1021 set to arbitrary values.

Based on a result of the above-mentioned measurement, it is so arranged that the power regenerating RF signal 1123 is output from the signal generator 1201, and the power regenerating RF signal 1021 is used for power regeneration when the powers $P_{OUT1}(t), \ldots, P_{OUT(n-1)}(t)$, and $P_{OUT(n)}(t)$ and the power $P_r(t)$ satisfy $P_{D(r\_on)}(t) < P_{D(r\_off)}(t)$. When the powers $P_{OUT1}(t), \ldots, P_{OUT(n-1)}(t)$, and $P_{OUT(n)}(t)$ and the power $P_r(t)$ satisfy $P_{D(r\_on)}(t) > P_{D(r\_off)}(t)$, it is so arranged that the power regenerating RF signal 1123 is not output from the signal generator 1201 and the power regenerating RFG signal 1021 is not used for power regeneration. Accordingly, power saving of the transmission apparatus is implemented by the control over the signal generator 1021 by the power detector 1301 or the on/off control over the power regenerating RF signal 1123.

Fourth Exemplary Embodiment

Next, a fourth exemplary embodiment will be described in detail, using the drawings.

Figure 25:
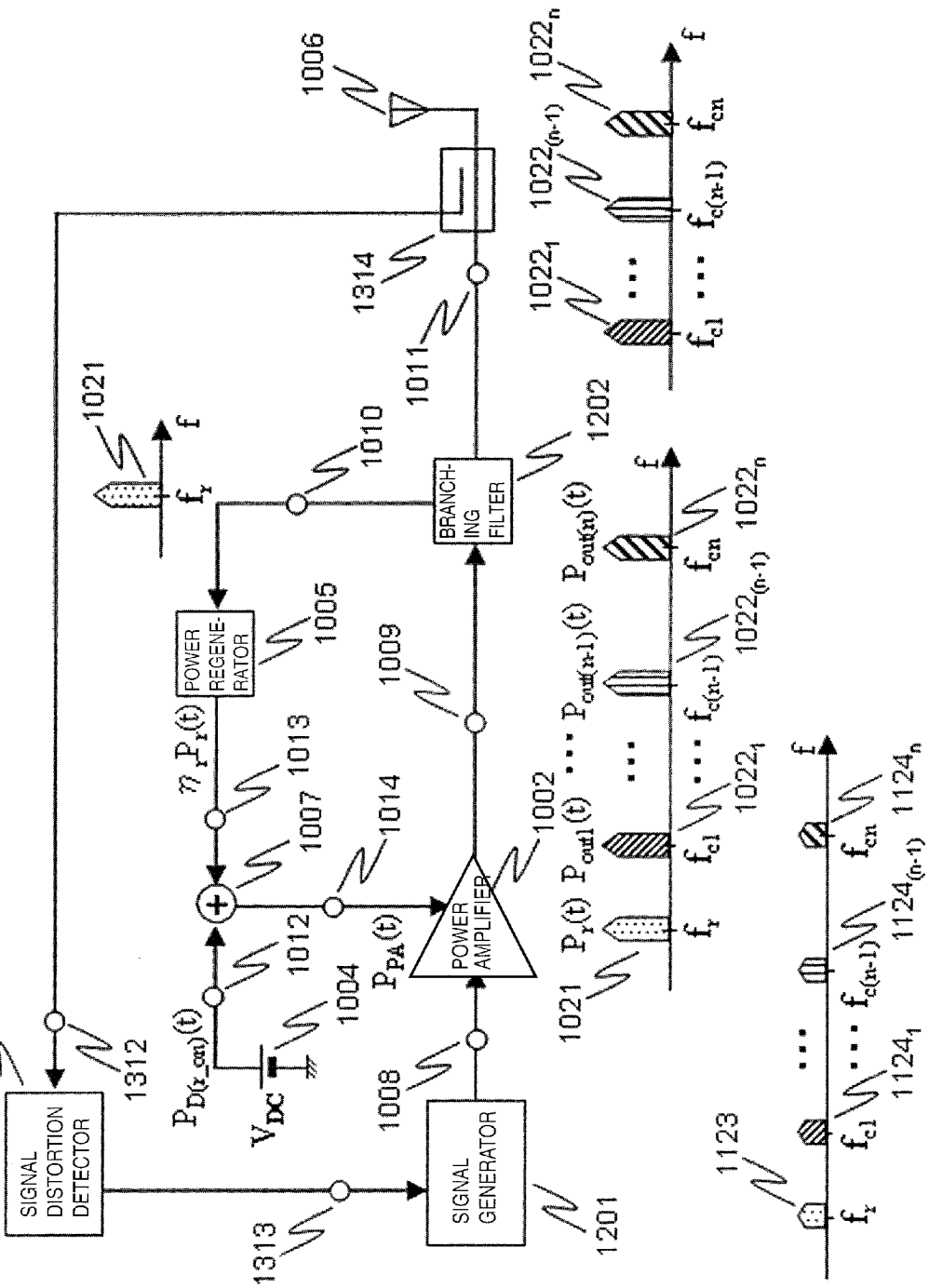
FIG. 25 is a block configuration diagram illustrating a block configuration of a transmission apparatus according to a fourth exemplary embodiment.

FIG. 25 is a block configuration diagram illustrating a block configuration of a transmission apparatus according to a fourth exemplary embodiment. The transmission apparatus according to the fourth exemplary embodiment illustrated in FIG. 25 is obtained by adding a signal distortion detector 1311 and a coupler 1314 to the transmission apparatus according to the second exemplary embodiment illustrated in FIG. 19. The coupler 1314 extracts RF signals $1022_1, \ldots, 1022_{(n-1)}$, and $1022_n$ at a terminal 1011, and outputs the extracted RF signals to the signal distortion detector 1311 through a terminal 1312.

Most of powers of the RF signals $1022_1, \ldots, 1022_{(n-1)}$, and $1022_n$ at the terminal 1011 are output to a transmitting antenna 1006. Herein, it is desirable to use the coupler with a degree of coupling which makes an amount of the powers to be supplied to the signal distortion detector 1311 to be sufficiently smaller than an amount of the powers to be supplied to the transmitting antenna 1006.

The signal distortion detector 1311 detects a signal distortion amount of the RF signals $1022_1, \ldots, 1022_{(n-1)}$, and $1022_n$. Then, the signal distortion detector 1311 performs control over a signal generator 1201 through a terminal 1303, based on information on the signal distortion amount of the RF signals $1022_1, \ldots, 1022_{(n-1)}$, and $1022_n$. Specifically, the signal generator 1201 determines whether or not to output a carrier frequency $f_r$, based on a result of detection by the signal distortion detector 1311.

Herein, as the signal distortion amount, adjacent channel leakage power (Adjacent Channel Leakage Power Ratio, ACPR), modulation accuracy (Error Vector Magnitude, EVM), an inter-modulation distortion (Inter-Modulation Distortion, IMD), or a modulation error ratio (Modulation Error Ratio, MER) may be used. The signal distortion detector may be implemented by a spectrum analyzer or a vector signal analyzer.

As an example of the control over the signal generator 1201 to be performed by the signal distortion detector 1311, setting of the carrier frequency $f_r$ of a power regenerating RF signal 1021 is provided. That is, the signal generator 1201 determines the carrier frequency $f_r$, based on a result of detection by the signal distortion detector 131.

Specifically, using the coupler 1314 and the signal distortion detector 131, the signal distortion amount of the RF signals $1022_1, \ldots, 1022_{(n-1)}$, and $1022_n$ when the carrier frequency $f_r$ of a power regenerating RF signal 1123 has been changed is measured. Then, the carrier frequency $f_r$ of the power regenerating RF signal 1123 to be output by the signal generator 1201 is set to a frequency that minimizes the signal distortion amount of the RF signals $1022_1, \ldots, 1022_{(n-1)}$, and $1022_n$. Accordingly, the control over the signal generator 1201 to be performed by the signal distortion detector 1311 improves accuracies of the transmission signals to be output from the transmission apparatus.

As another example of the control over the signal generator 1201 to be performed by the signal distortion detector 1311, on/off control over the power regenerating RF signal 1123 is provided. Using the coupler 1314 and the signal distortion detector 1311, the signal distortion amount of the RF signals $1022_1, \ldots, 1022_{(n-1)}$, and $1022_n$ when the power regenerating RF signal 1123 has been output from the signal generator 1201 and a signal distortion amount of the RF signals $1022_1, \ldots, 1022_{(n-1)}$, and $1022_n$ when the power regenerating RF signal 1123 is not output from the signal generator 1201 are measured, with powers $P_{OUT1}(t), \ldots, P_{OUT(n-1)}(t)$, and $P_{OUT(n)}(t)$ of the data transmitting RF signals $1022_1, \ldots, 1022_{(n-1)}$, and $1022_n$ and power $P_r(t)$ of the power regenerating RF signal 1021 set to arbitrary values.

Output or nonoutput of the power regenerating RF signal 1123 from the signal generator 1201 is so selected that the signal distortion amount of the RF signals $1022_1, \ldots, 1022_{(n-1)}$, and $1022_n$ in respective states of the powers $P_{OUT1}(t), \ldots, P_{OUT(n-1)}(t)$, and $P_{OUT(n)}(t)$ is improved. Accordingly, the accuracies of the transmission signals of the transmission apparatus are improved by the control over the signal generator 1201 by the signal distortion detector 1311, or the on/off control over the power regenerating RF signal 1123.

Fifth Exemplary Embodiment

Next, a fifth exemplary embodiment will be described in detail using the drawings.

Figure 26:
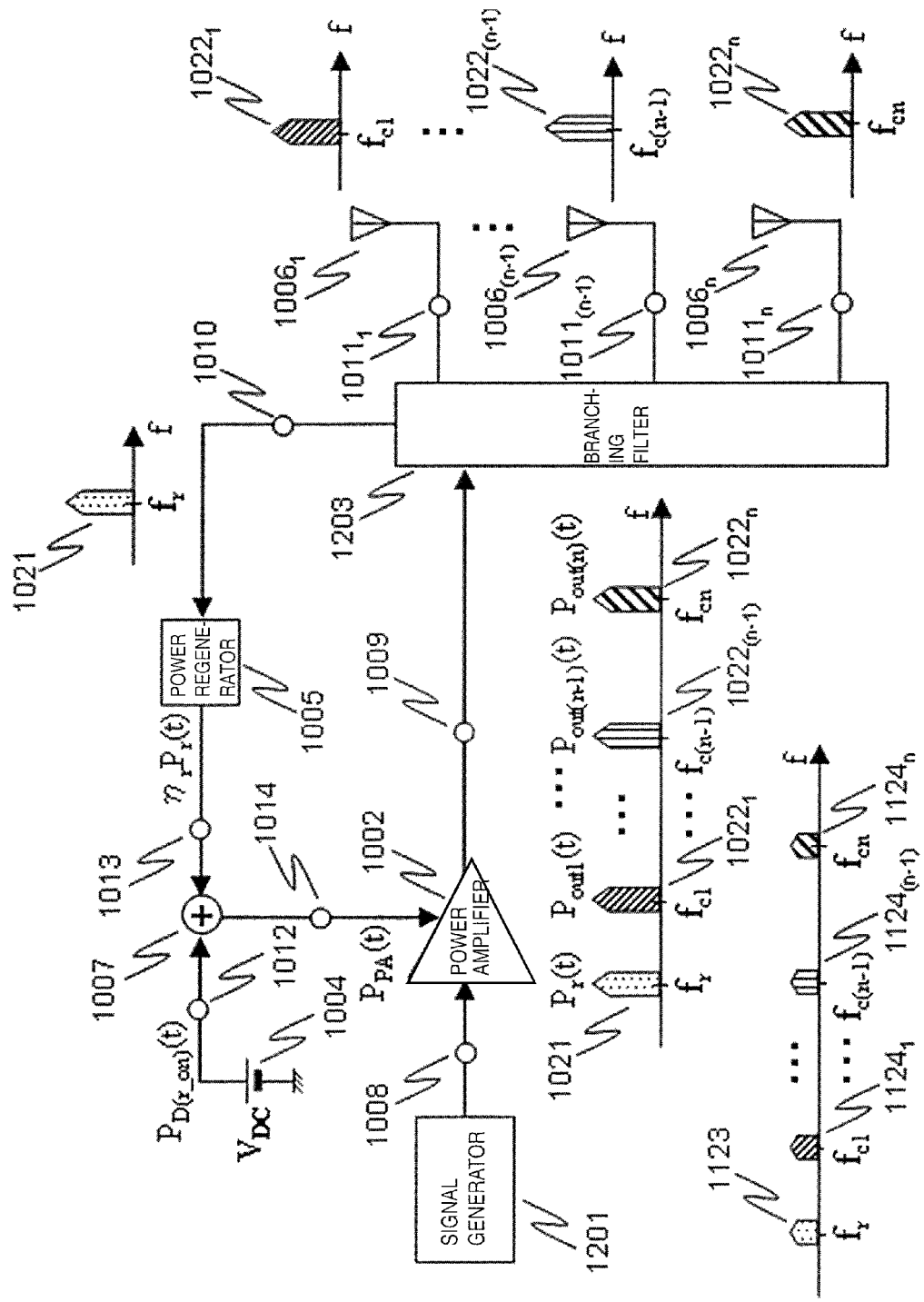
FIG. 26 is a block configuration diagram illustrating a block configuration of a transmission apparatus according to a fifth exemplary embodiment.

FIG. 26 is a block configuration diagram showing a block configuration of a transmission apparatus according to a fifth exemplary embodiment. The transmission apparatus according to the fifth exemplary embodiment illustrated in FIG. 26 is obtained by adding a plurality of transmitting antennas $1006_1, \ldots, 1006_{(n-1)}$, and $1006_n$ and output terminals $1011_1, \ldots, 1011_{(n-1)}$, and $1011_n$ of a plurality of data transmitting RF signals of a branching filter 1203. Elements of the transmission apparatus according to the fifth exemplary embodiment illustrated in FIG. 26 other than the transmitting antennas $1006_1, \ldots, 1006_{(n-1)}$, and $1006_n$ and the output terminals $1011_1, \ldots, 1011_{(n-1)}$, and $1011_n$ of the plurality of data transmitting RF signals of the branching filter 1203 have the same functions and configurations as those of the transmission apparatus according to the second exemplary embodiment illustrated in FIG. 19.

The branching filter 1203 in the fifth exemplary embodiment illustrated in FIG. 26 respectively outputs data transmitting RF signals $1022_1, \ldots, 1022_{(n-1)}$, and $1022_n$ of carrier frequencies $f_{c1}, f_{c(n-1)}$, and $f_{cn}$ to the transmitting antennas $1006_1, \ldots, 1006_{(n-1)}$, and $1006_n$ through the terminals $1011_1, \ldots, 1011_{(n-1)}$, and $1011_n$, and outputs a power regenerating RF signal 1021 of a carrier frequency $f_r$ to a power regenerator 1005 through a terminal 1010. In the fifth exemplary embodiment as well, the power regenerating RF signal 1021 is converted into low frequency power by the power regenerator 1005, and is reused as power to be supplied to a power amplifier 1002, as in the first exemplary embodiment.

Figure 27:
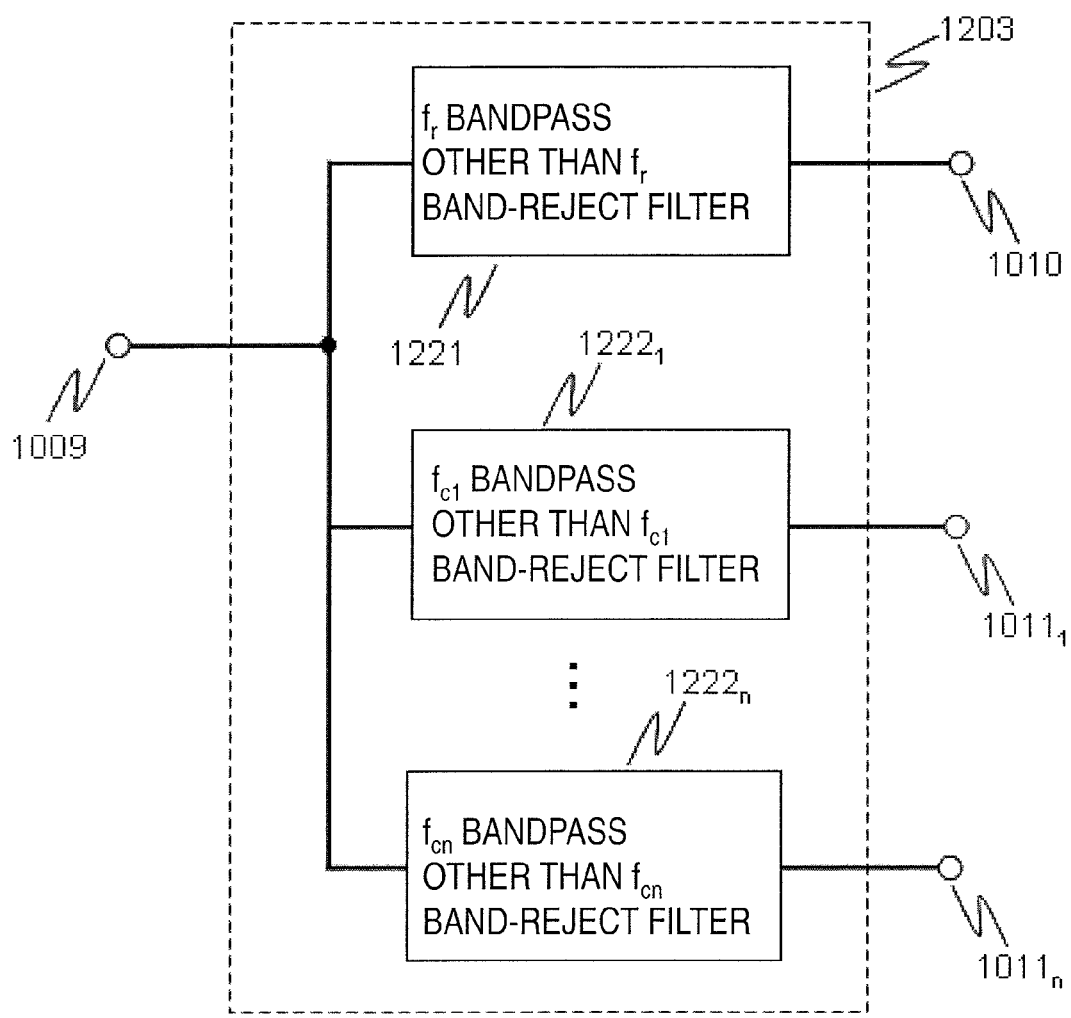
FIG. 27 is a block configuration diagram illustrating a block configuration of a branching filter in the transmission apparatus in the fifth exemplary embodiment.

The branching filter 1203 in the transmission apparatus according to the fifth exemplary embodiment illustrated in FIG. 26 has an internal configuration disclosed in a block configuration diagram in FIG. 27, as an example. The branching filter 1203 illustrated in FIG. 27 has a configuration in which a filter 1221 is installed between the terminal 1009 and the terminal 1010 and filters $1022_1, \ldots, 1022_{(n-1)}$, and $1022_n$ are respectively installed between the terminal 1009 and the terminal $1011_1, \ldots$, between the terminal 1009 and the terminal $1011_{(n-1)}$, and between the terminal 1009 and the terminal $1011_n$. The filter 1221 passes the power regenerating RF signal 1021 of the carrier frequency $f_r$ and shut off the RF signals of the other bands. The filters $1022_1, \ldots, 1022_{(n-1)}$, and $1022_n$ pass respectively the data transmitting RF signals 1022, of the carrier frequencies $f_{c1}, \ldots, f_{c(n-1)}$, and $f_{cn}$ and shut off the RF signals of the other bands. With the above-mentioned arrangement, the function of outputting the RF signals that are different for the respective carrier frequencies is implemented.

The fifth exemplary embodiment also has the characteristic illustrated in the characteristic diagram in FIG. 18, based on the same principle as that in each of the first and second exemplary embodiments, so that power saving of the transmission apparatus can be implemented.

Sixth Exemplary Embodiment

Next, a sixth exemplary embodiment will be described in detail using the drawings. A transmission apparatus according to this exemplary embodiment comprises a carrier selection unit 1402 that determines a carrier frequency $f_c$ and a carrier frequency $f_r$, based on a result of comparison between total power of a predetermined third frequency and predetermined reference power.

Figure 28:
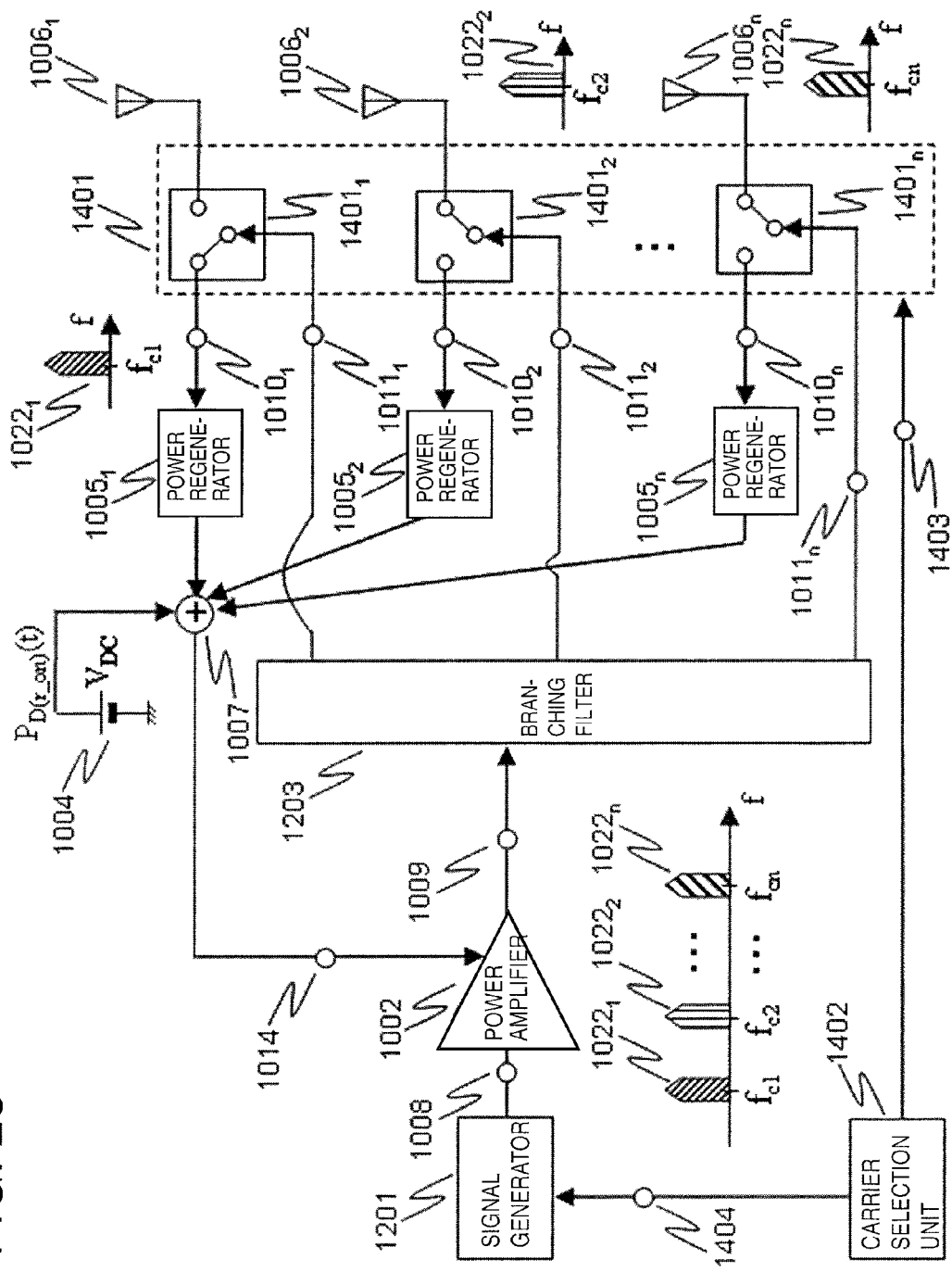
FIG. 28 is a block configuration diagram illustrating a block configuration of a transmission apparatus according to a sixth exemplary embodiment.

FIG. 28 is a block configuration diagram showing a block configuration of the transmission apparatus according to the sixth exemplary embodiment. In the transmission apparatus according to the sixth exemplary embodiment illustrated in FIG. 28, switches $1401_1, 1401_2, \ldots, 1401_n$ are respectively inserted between output terminals $1011_1, 1011_2, \ldots,$ and $1011_n$ of a branching filter 1203 and transmitting antennas $1006_1, 1006_2, \ldots,$ and $1006_n$. Further, power regenerators $1005_1, 1005_2, \ldots,$ and $1005_n$ are respectively installed between output terminals $1010_1, 1010_2, \ldots,$ and $1010_n$ of the switches $1401_1, 1401_2, \ldots, 1401_n$ and a power combiner 1007. Further, the carrier selection unit 1402 is installed.

A power regenerating RF signal 1021 of the carrier frequency $f_r$ is not used, and data transmitting RF signals RF signals $1022_1, \ldots, 1022_{(n-1)}$, and $1022_n$ of carrier frequencies $f_{c1}, \ldots, f_{c(n-1)}$, and $f_{cn}$ are used in the transmission apparatus according to the sixth exemplary embodiment. For that reason, units related to the power regenerating RF signal 1021 of the carrier frequency $f_r$ in the internal configuration of the signal generator 1201 illustrated in FIG. 20, or the power regeneration control data generator 1101, the mixer 1103, and the LO signal generator 1105 do not need to be installed. Similarly, units related to the power regenerating RF signal 1021 of the carrier frequency $f_r$ in the internal configuration of the branching filter 1203 illustrated in FIG. 27 or the filter 1221 and the terminal 1010 do not need to be installed.

The carrier selection unit 1402 in the transmission apparatus according to the sixth exemplary embodiment illustrated in FIG. 28 selects one or more of the data transmitting RF signals $1022_1, \ldots,$ and $1022_n$ to be used for communication. The RF signal(s) and the number of the RF signals to be used for the communication may be arbitrarily selected, and the RF signal(s) to be used for the communication may be changed according to the time. FIG. 28 illustrates a case where the RF signal $1022_1$ is not used for the communication and the RF signals $1022_2, \ldots,$ and $1022_n$ other than the RF signal $1022_1$ are used for the communication, as one example. Temporal variations of powers of the RF signals ($1022_2, \ldots,$ and $1022_n$ in FIG. 28) to be used for the communication and to be output from the power amplifier 1002 are determined by data to be transmitted. In this exemplary embodiment, the total of powers of one or more of the RF signals ($1022_1$ in FIG. 28) to be output from the power amplifier 1002 and not to be used for the communication is defined as expressed in the following Equation (9):

[Equation 9]

$$P\_not\_use = P\_base - P\_use \qquad (9)$$

where $P\_not\_use$ is the total of the powers of the one or more of the RF signals to be output from the power amplifier 1002 and not to be used for the communication, $P\_base$ is reference power, and $P\_use$ is the total of the powers of the one or more of the RF signals to be output from the power amplifier 1002 and to be used for the communication. Herein, the reference power may be set to be the saturation output of the power amplifier 1002, or power obtained by removing a back-off amount from the saturation output of the power amplifier 1002. The carrier selection unit 1402 controls the powers of the RF signals to be output from the signal generator 1201 through a terminal 1401 such that the relationship in the Equation (9) is satisfied.

The carrier selection unit 1402 performs switchover of one or more of the switches ($1401_2, \ldots, 1401_n$ in FIG. 28) such that the one or more of the RF signals ($1022_2, \ldots,$ and $1022_n$ in FIG. 28) to be used for the communication are output to one or more of the transmitting antennas ($1006_1, \ldots, 1006_{(n-1)}$, and $1006_n$). Further, the carrier selection unit 1402 performs switchover of one or more of the switches ($1401_1$ in FIG. 28) such that the one or more of the RF signals ($1022_1$ in FIG. 28) not to be used for the communication are output to one or more of the power regenerators ($1005_1$ in FIG. 28). The one or more of the RF signals supplied to the one or more of the power regenerators $1005_1, 1005_2, \ldots,$ and $1005_n$ are converted into low frequency power(s) and are then output to a power combiner 1007.

The power combiner 1007 outputs to a power supplying terminal 1014 of the power amplifier 1002 combined power obtained by combining the powers supplied from the one or more of the power regenerators $1005_1, 1005_2, \ldots,$ and $1005_n$ and power from a direct-current voltage source 1004. The power combiner 1007 herein may have a configuration of a parallel combined type in which an input terminal and an output terminal of the power combiner 1007 are directly connected. Alternatively, the power combiner 1007 may have a configuration of a serial combined type in which the input terminal of the power combiner 1007 is connected to a primary side of a transformer element and the output terminal of the power combiner 1007 is connected to a secondary side of the transformer element, based on the configuration in FIG. 12. As mentioned above, in the transmission apparatus according to the sixth exemplary embodiment, the one or more of the RF signals ($1022_1$ in FIG. 28) not to be used for the communication are converted into the low frequency power(s) by the one or more of the power regenerators ($1005_1$ in FIG. 28), for reuse as power to be supplied to the power amplifier 1002.

In the transmission apparatus according to the sixth exemplary embodiment illustrated in FIG. 28, the one or more of the RF signals of one or more of the carrier frequencies not to be used for the communication are used for power regeneration according to a usage condition of the communication.

Power saving of the transmission apparatus can be thereby implemented, based on the same principle as that in the first to fifth exemplary embodiment.

Variation Example of Sixth Exemplary Embodiment

Net, a variation example of the sixth exemplary embodiment will be described in detail, using the drawings.

Figure 29:
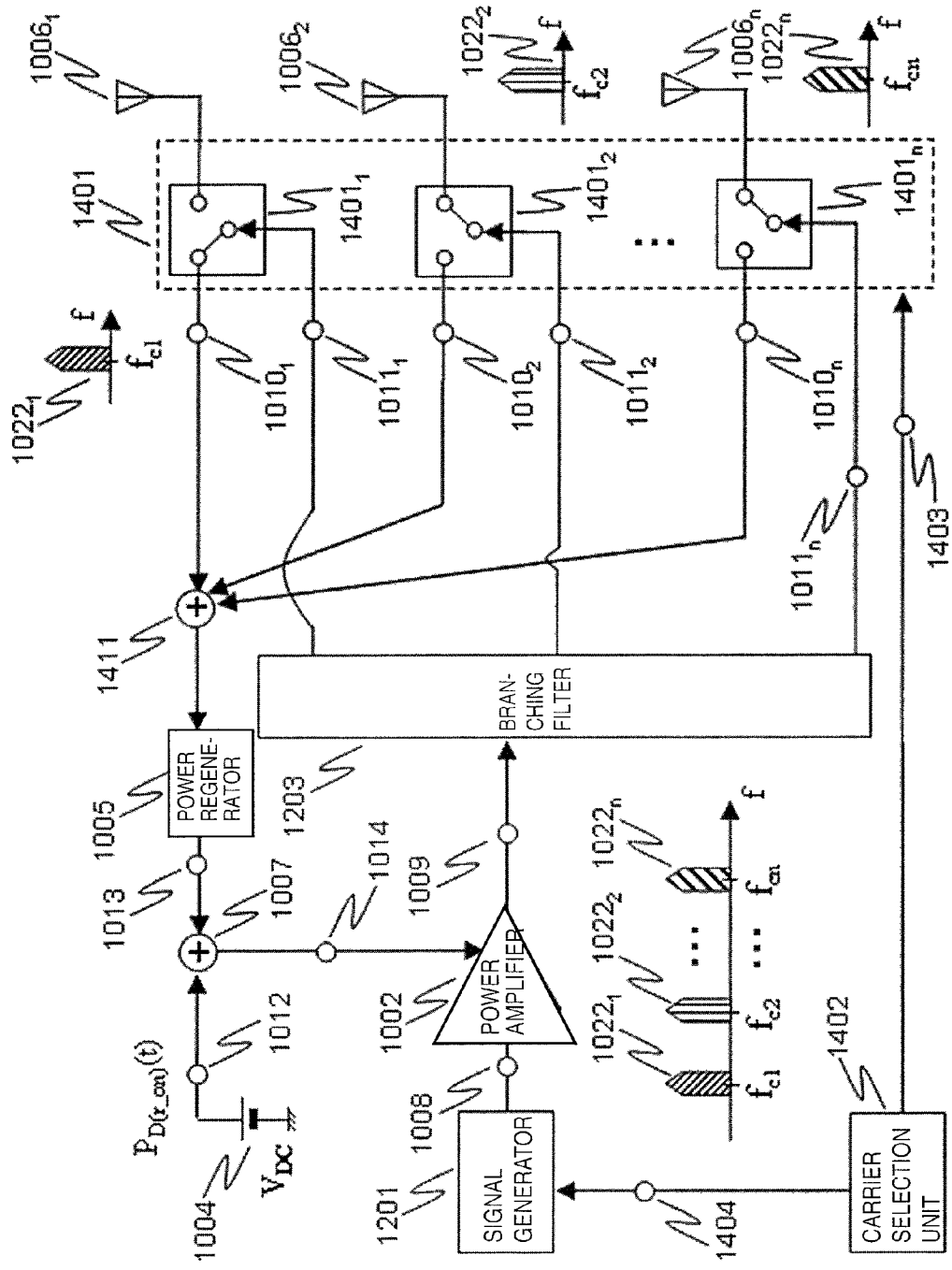
FIG. 29 is a block configuration diagram illustrating a block configuration of a transmission apparatus in a variation example of the sixth exemplary embodiment.
Figure 30:
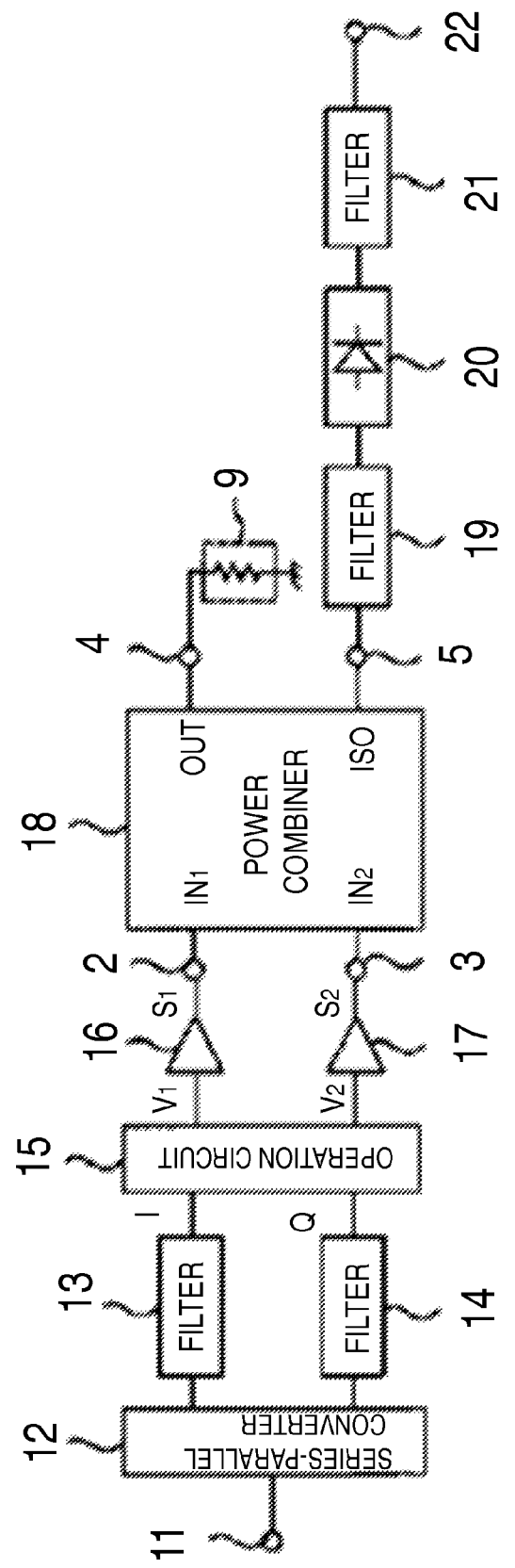
FIG. 30 is a block configuration diagram illustrating a block configuration of a transmission apparatus described in Patent Literature 1.
Figure 31:
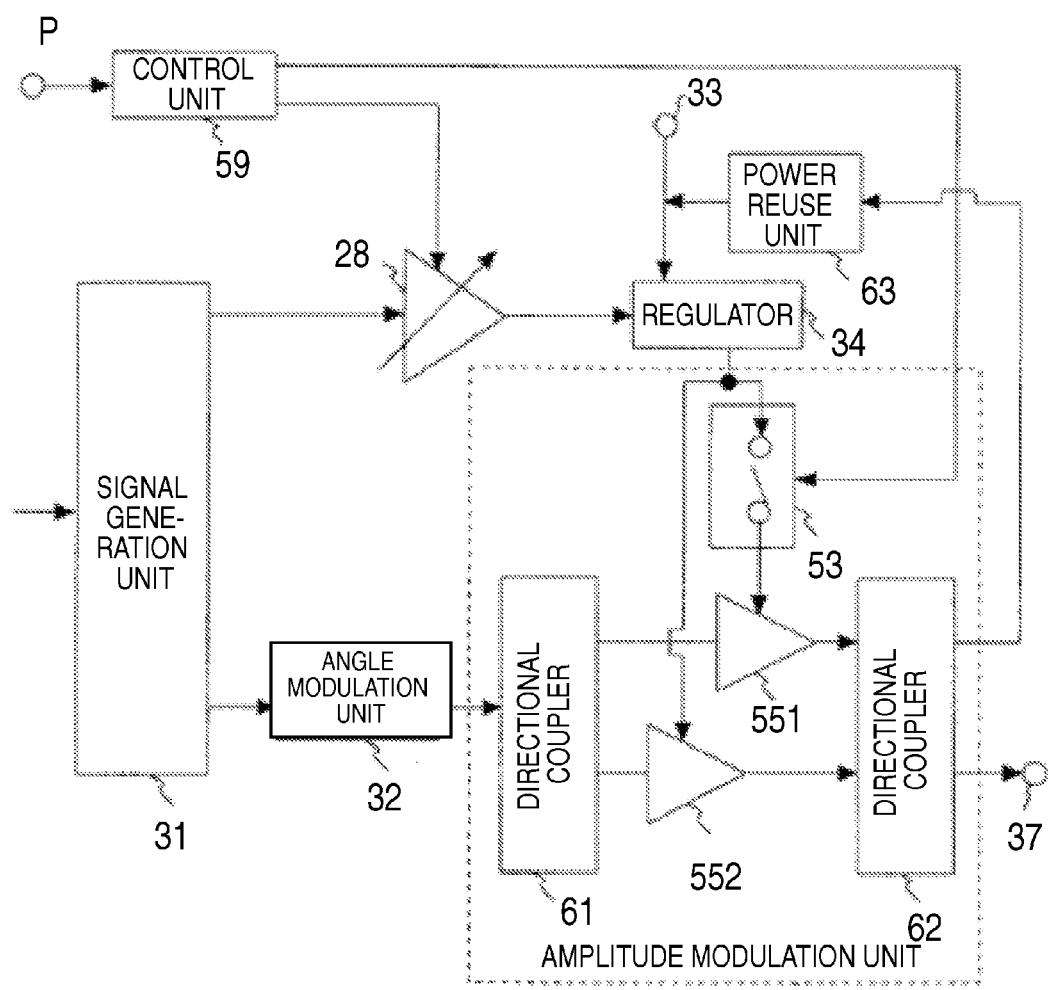
FIG. 31 is a block configuration diagram illustrating a block configuration of a transmission apparatus described in Patent Literature 2.
Figure 32:
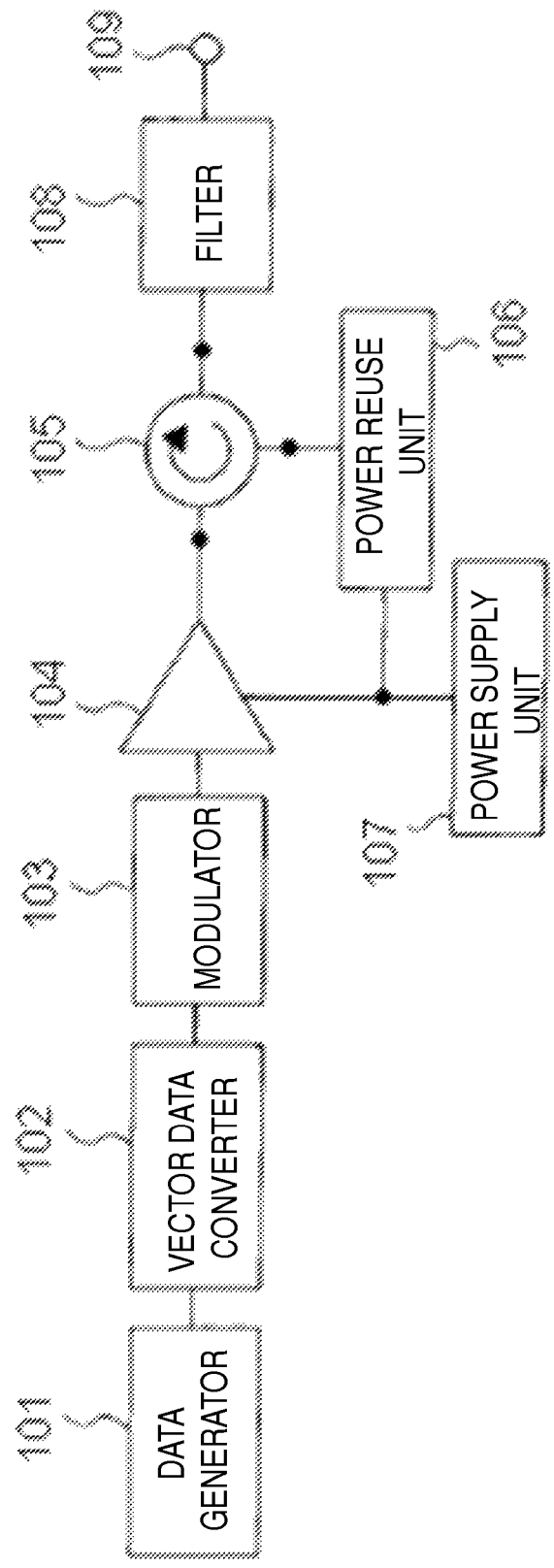
FIG. 32 is a block configuration diagram illustrating a block configuration of a transmission apparatus described in Patent Literature 3.
Figure 33:
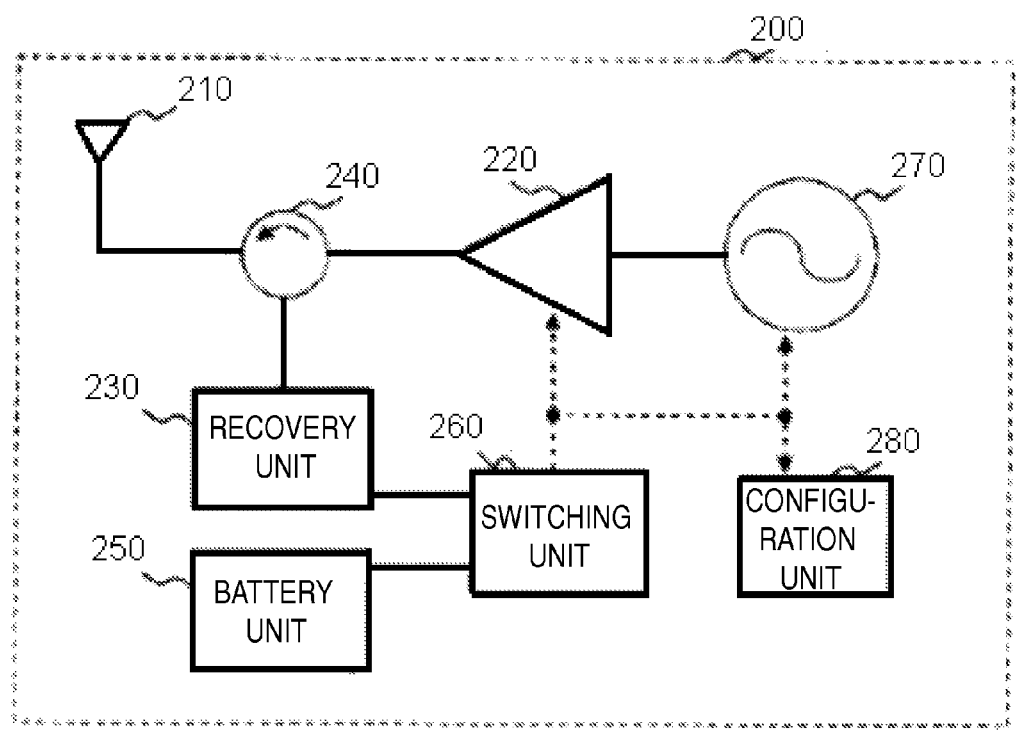
FIG. 33 is a block configuration diagram illustrating a block configuration of a transmission apparatus described in Patent Literature 4.
Figure 34:
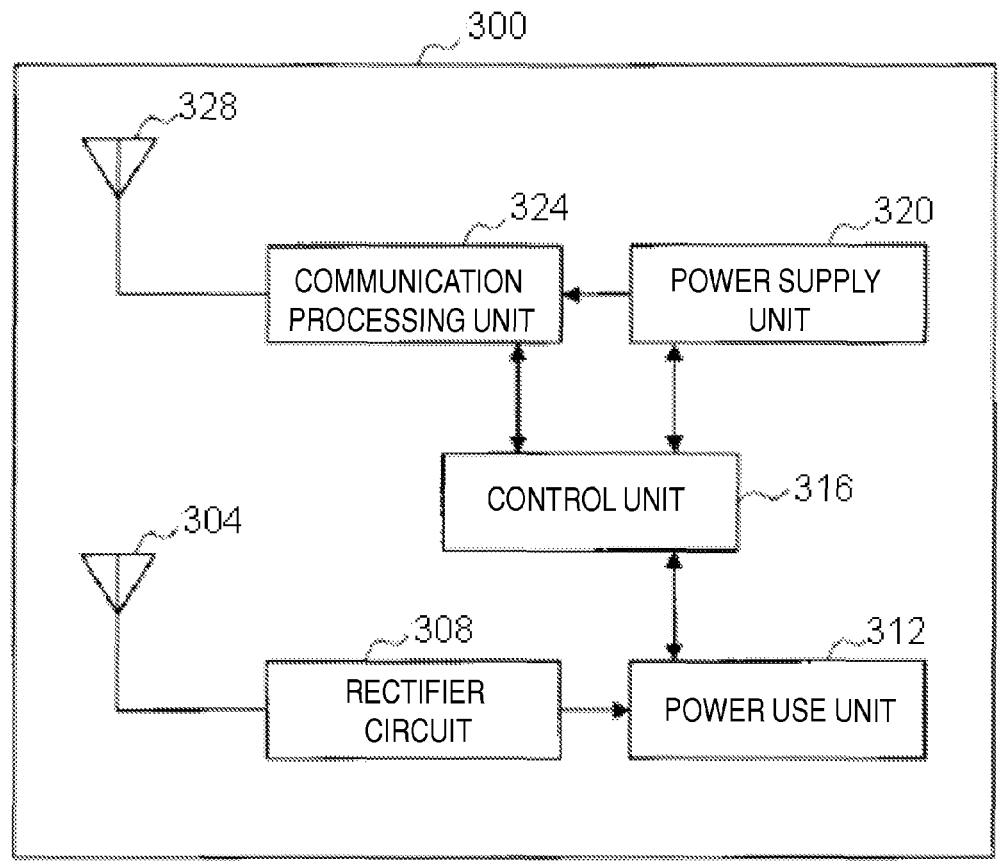
FIG. 34 is a block configuration diagram illustrating a block configuration of a transmission apparatus described in Patent Literature 5.
Figure 35:
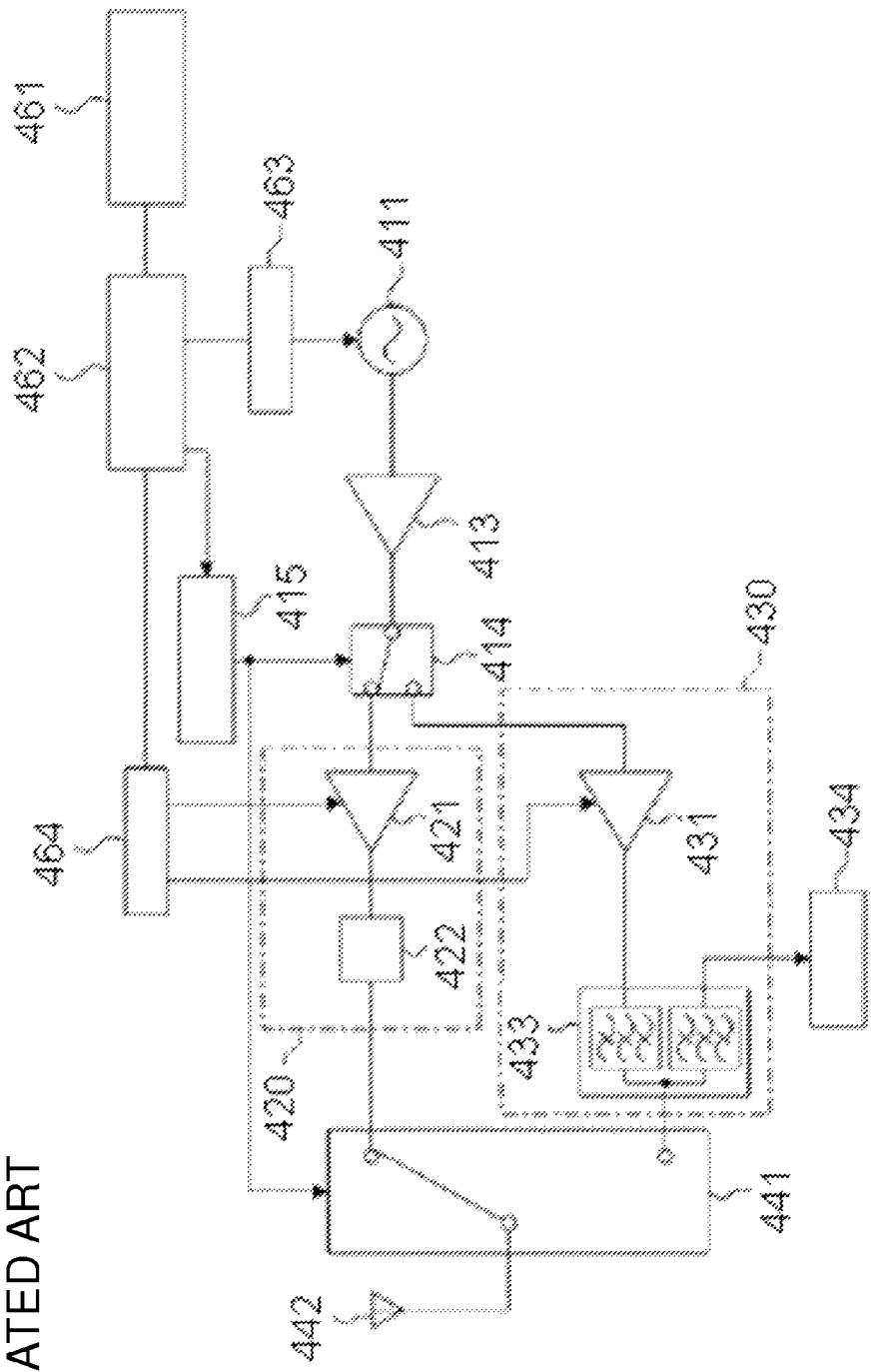
FIG. 35 is a block configuration diagram illustrating a block configuration of a transmission apparatus described in Patent Literature 6.

FIG. 29 is a block configuration diagram illustrating a block configuration of a transmission apparatus in the variation example of the sixth exemplary embodiment. In the transmission apparatus in the variation example of the sixth exemplary embodiment illustrated in FIG. 29, one power regenerator 1005 is used, in place of a plurality of the power regenerators $1005_1$, $1005_2$, ..., and $1005_n$ in the sixth exemplary embodiment illustrated in FIG. 28. Then, an RF signal combiner 1411 is newly installed between the power regenerator 1005 and the switches 1401.

In the transmission apparatus in the variation example of the sixth exemplary embodiment illustrated in FIG. 29, one or more of data transmitting RF signals $1022_1$, $1022_2$, ..., and $1022_n$ to be used for communication are selected, as in the transmission apparatus in the sixth exemplary embodiment illustrated in FIG. 28. The total of powers of one or more of the output RF signals ($1022_1$ in FIG. 29) not to be used for the communication is set by the Equation (9).

In the transmission apparatus in the variation example of the sixth exemplary embodiment illustrated in FIG. 29, the carrier selection unit 1402 performs switchover of one or more of the switches ($1401_2$, ..., $1401_n$ in FIG. 29) such that the one or more of the RF signals ($1022_2$, ..., and $1022_n$ in FIG. 29) to be used for the communication are output to one or more of the transmitting antennas ($1006_2$, ..., and $1006_n$ in FIG. 29). The carrier selection unit 1402 performs switchover of one or more of the switches ($1401_1$ in FIG. 29) such that the one or more of the RF signals not to be used for the communication ($1022_1$ in FIG. 29) are output to the RF signal combiner 1411.

The RF signal combiner 1411 combines the one of more of the RF signals supplied from the one or more of the switches 1401, and outputs an RF signal obtained by the combination to the power regenerator 1005. The RF signal supplied to the power regenerator 1005 is converted into low frequency power and is output to the power combiner 1007.

The power combiner 1007 outputs to the power supplying terminal 1014 of the power amplifier 1002 combined power obtained by combining the power supplied from the power regenerator 1005 and power from the direct-current voltage source 1004. As mentioned above, in the variation example of the sixth exemplary embodiment, the one or more of the RF signals ($1022_1$ in FIG. 29) not to be used for the communication are converted into the low frequency power by the power regenerator 1005, for reuse as power to be supplied to the power amplifier 1002.

In the transmission apparatus in the variation example of the sixth embodiment illustrated in FIG. 29, the one or more of the RF signals of one or more of the carrier frequencies not to be used for the communication are used for power regeneration according to the usage condition of the communication. Power saving of the transmission apparatus can be thereby implemented, based on the same principle as that in the sixth exemplary embodiment.

As compared with the transmission apparatus disclosed in each of Patent Literatures 1 to 10, the transmission apparatus disclosed in this application has the following effects.

In the case of the transmission apparatus described in each of Patent Literatures and 1 and 2, the frequency that can be used for transmission is substantially limited to one band and cannot accommodate the CA technology that simultaneously uses a plurality of bands for transmission. In the technique described in each of Patent Literatures 1 and 2, two PAs are used for transmission of one band. However, as the number of the power amplifiers increases, the circuit size and cost will increase.

Similarly, in the case of the technique described in each of Patent Literatures 6 to 10, it is necessary to install the power amplifiers being equal in number to the bands to be used for achieving multi-band of the transmission apparatus. Thus, as the number of the power amplifiers increases, the circuit size and cost will increase. Further, in the case of the technique described in each of Patent Literatures 6 to 10, the method of switching the power amplifier for use by the band selection switch is employed. Thus, the RF signals of all the bands that are accommodated by the transmitter cannot be simultaneously output. For this reason, the technique described in each of Patent Literatures 6 to 10 is not suited to the CA technology that performs communication by simultaneously using a plurality of bands.

On contrast therewith, in the case of the transmission apparatus in the present exemplary embodiment, one power amplifier can simultaneously amplify the RF signals of n carrier frequencies. That is, the transmission apparatus in this exemplary embodiment can accommodate the CA technology that simultaneously uses a plurality of bands for transmission while reducing the number of PAs to reduce the circuit size and cost.

In the case of the technique described in Patent Literature 3, the frequency of the power for reuse distributes over a wide band. Thus, the power that is not within the frequency range accommodated by the circuit cannot be reused, so that the power loss is produced.

On contrast therewith, in the case of the transmitter in the present exemplary embodiment, the frequency of power for reuse can be set to a single band. Thus, the frequency of power for reuse can be readily set to a frequency accommodated by the circuit. In other words, a power loss to be caused by distribution of the frequency of power for reuse over a wide band can be avoided.

In the case of the technique described in Patent Literature 4, the condition that allows power saving by reuse of power is limited to the case where the reflected power is produced at the antenna due to the matching deviation.

On contrast therewith, in the case of the transmission apparatus in the present exemplary embodiment, the output power of the power amplifier rather than reflected power produced due to a matching deviation is reused. Consequently, by outputting the power to the power amplifier regardless of presence or absence of the matching deviation, power saving of the transmission apparatus by reuse of the power can be implemented. Further, output of the power from the power amplifier can be readily subjected to the on/off control. Thus, whether or not to reuse the power can be readily controlled according to the condition.

In the case of the technique described in Patent Literature 5, the power that can be reused is just the portion of power of the RF signal emitted from the transmitting antenna into the air. Further, the frequency and the power of the RF signal emitted from the transmitting antenna into the air are constrained by the Radio Law. Consequently, the frequency and power of the RF signal that can be recovered by the power recovery antenna are also constrained by the Radio Law.

On contrast therewith, in the case of the transmission apparatus in the present exemplary embodiment, the power regenerating RF signal is not emitted into the air, and is reused as the power, being blocked in the circuit. Thus, the RF signal can be reused as the power, with a high efficiency. Further, the power regenerating RF signal is not emitted into the air. Thus, the frequency and the power of the power regenerating RF signal are not constrained by the Radio Law.

In the technique in each of Patent Literature 2 and Patent Literatures 6 and 10, the polar modulation technique of controlling the power from the power source to a PA according to modulation of the RF signal is applied in order to maintain the high power efficiency at the time of back-off. In the polar modulation technique, the power source circuit needs to output a power waveform correctly corresponding to the RF output signal of the PA in order to reduce the error of the RF output signal of the PA. However, it is difficult to output, from the power source circuit, power that varies at a high speed, with a high accuracy, so that compatibility between the accuracy and the modulation speed of the RF signal of the PA cannot be achieved.

On contrast therewith, in the case of the transmission apparatus in the present exemplary embodiment, it is enough to supply smoothed power from the power regenerator to the PA, and the need for outputting the power waveform correctly corresponding to the RF output signal of the PA as in the case of the polar modulation technique is eliminated. That is, in the case of the transmission apparatus in the present exemplary embodiment, the problem of compatibility between the accuracy and the modulation speed of the RF signal of the PA encountered in a polar modulator can be avoided.

The above-mentioned exemplary embodiments can be partially or all described as follows, but are not limited to the modes to be described below.
(First Mode)
See the transmission apparatus according to the first aspect.
(Second Mode)
The transmission apparatus according to the first mode, comprising:
a carrier selection unit that determines the first frequency and the second frequency, based on a result of comparison between a total of powers of one or more of the signals of a predetermined frequency and predetermined reference power.
(Third Mode)
The transmission apparatus according to the first or second mode, comprising:
a power detector that detects the power supply power; wherein
the signal generator determines whether or not to output the signal of the second frequency, based on a result of detection by the power detector.
(Fourth Mode)
The transmission apparatus according to the third mode, wherein
the signal generator determines the second frequency, based on the result of detection by the power detector.
(Fifth Mode)
The transmission apparatus according to any one of the first to fourth modes, comprising:
a signal distortion detector that detects a signal distortion amount of the input signals; wherein
the signal detector determines whether or not to output the signal of the second frequency, based on a result of detection by the signal distortion detector.
(Sixth Mode)
The transmission apparatus according to the fifth mode, wherein the signal generator determines the second frequency, based on the result of detection by the signal distortion detector.
(Seventh Mode)
The transmission apparatus according to any one of the first to sixth mode, wherein
the signal generator estimates a total of amplified powers of the input signals as total amplified power, based on a power amplification factor of the power amplifier, and controls powers of the input signals according to the total amplified power.
(Eighth Mode)
The transmission apparatus according to the seventh mode, wherein
the signal generator determines whether or not to output the signal of the second frequency according to a result of comparison between the total amplified power and predetermined reference power.
(Ninth Mode)
The transmission apparatus according to the seventh or eighth mode, wherein
the signal generator generates the input signals such that the total amplifier power matches the predetermined reference power.
(Tenth Mode)
The transmission apparatus according to the ninth mode, wherein
the signal generator determines saturation power of the power amplifier as the reference power.
(Eleventh Mode)
The transmission apparatus according to any one of the first to tenth mode, wherein
the power regenerator comprises at least a matching circuit and a rectifier circuit, the matching circuit takes impedance matching between an input to the rectifier circuit and an output of the branching filter, for the second frequency, and the rectifier circuit is constituted from a diode.
(Twelfth Mode)
The transmission apparatus according to any one of the first to eleventh modes, wherein
the second frequency is lower than the first frequency.
(Thirteenth Mode)
See the transmission method according to the second aspect.
(Fourteenth Mode)
The transmission method according to the thirteenth mode, comprising:
determining the first frequency and the second frequency, based on a result of comparison between a total of powers of one or more of the signals of a predetermined frequency and predetermined reference power.
(Fifteenth Mode)
The transmission method according to the thirteenth or fourteenth mode, comprising:
detecting the power supply power; wherein
in the signal generation step, it is determined whether or not to output the signal of the second frequency, based on a result of detection in the power detection step.
(Sixteenth Mode)
The transmission method according to any one of the thirteenth to fifteenth modes, comprising: detecting a signal distortion amount of the input signals; wherein
it is determined whether or not to output the signal of the second frequency, based on a result of detection in the signal distortion detection step.
(Seventeenth Mode)
The transmission method according to any one of the thirteenth to sixteenth modes, wherein
a total of amplified powers of the input signals is estimated as total amplified power, based on a power amplification factor of the power amplifier, and powers of the input signals are controlled according to the total amplified power.

(Eighteenth Mode)

The transmission method according to the seventeenth mode, wherein it is determined whether or not to output the signal of the second frequency according to a result of comparison between the total amplified power and predetermined reference power.

Each disclosure of the above-listed Patent Literatures and so forth is incorporated herein by reference. Modification and adjustment of each exemplary embodiment and each example are possible within the scope of the overall disclosure (including the claims) of the present invention and based on the basic technical concept of the present invention. Various combinations and selections of various disclosed elements (including each element in each claim, each element in each exemplary embodiment and each example, each element in each drawing, and the like) are possible within the scope of the claims of the present invention. That is, the present invention naturally includes various variations and modifications that could be made by those skilled in the art according to the overall disclosure including the claims and the technical concept. With respect to a numerical value range described herein, an arbitrary numerical value and a small range included in the numerical value range should be construed to be specifically described even unless otherwise explicitly described.

1001, 1201, 2001 signal generator
1002, 2002 power amplifier
1003, 1202, 1203, 2003 branching filter
1004 direct-current voltage source
1005, 2005 power regenerator
1006 transmitting antenna
1007, 2007 power combiner
1008~1014, 1043, 1302, 1303, 1312, 1313, 1403, 1404 terminal
1021, 1123 power regenerating RF signal
1022, 1124 data transmitting RF signal
1031 transistor
1032, 1033, 1041 matching circuit
1034 input bias circuit
1035 output bias circuit
1036 bias terminal
1042 rectifier circuit
1051, 1052, 1053 diode element
1061, 1063 inductor element
1062, 1064, 1071~1073, 1083~1085 capacitance element
1081, 1082 transformer element
1091, 1092, 1211, 1212, 1221, 1222 filter
1101 power regeneration control data generator
1102 transmission data generator
1103, 1104 mixer
1105, 1106 local oscillator (LO) signal generator
1107, 1411 RF signal combiner
1121 power regeneration controlling baseband signal
1122 data transmitting baseband signal
1301 power detector
1304 current probe
1311 signal distortion detector
1314 coupler
1401 switch
1402 carrier selection unit
2004 data transmitter
2006 voltage source

The invention claimed is:

1. A transmission apparatus comprising:
    a signal generator that generates input signals of two or more bands of frequencies and outputs the generated input signals;
    a power amplifier that amplifies the input signals and outputs amplified signals;
    a branching filter that outputs branched signals for the respective frequencies from the amplified signals;
    a data transmitter that transmits data based on one of the branched signals of a first frequency;
    a power regenerator that converts one of the branched signals of a second frequency into regenerated power and outputs the regenerated power; and
    a power combiner that combines the regenerated power and power supply power output from a voltage source, as combined power, and supplies the combined power to the power amplifier.

2. The transmission apparatus according to claim 1, comprising:
    a carrier selection unit that determines the first frequency and the second frequency, based on a result of comparison between a total of powers of one or more of the signals of a predetermined frequency and predetermined reference power.

3. The transmission apparatus according to claim 1, comprising:
    a power detector that detects the power supply power; wherein
    the signal generator determines whether or not to output the signal of the second frequency, based on a result of detection by the power detector.

4. The transmission apparatus according to claim 3, wherein
    the signal generator determines the second frequency, based on the result of detection by the power detector.

5. The transmission apparatus according to claim 1, comprising:
    a signal distortion detector that detects a signal distortion amount of the input signals; wherein
    the signal generator determines whether or not to output the signal of the second frequency, based on a result of detection by the signal distortion detector.

6. The transmission apparatus according to claim 5, wherein
    the signal generator determines the second frequency, based on the result of detection by the signal distortion detector.

7. The transmission apparatus according to claim 1, wherein
    the signal generator estimates a total of amplified powers of the input signals as total amplified power, based on a power amplification factor of the power amplifier, and controls powers of the input signals according to the total amplified power.

8. The transmission apparatus according to claim 7, wherein
    the signal generator generates the input signals such that the total amplifier power matches predetermined reference power.

9. The transmission apparatus according to claim 1, wherein
    the second frequency is lower than the first frequency.

10. A signal transmission method using a transmission apparatus comprising a power amplifier that amplifies input signals and outputs amplified signals, the transmission method comprising:

generating the input signals of bands of two or more frequencies and outputting the generated input signals;

outputting branched signals for the respective frequencies from the amplified signals;

transmitting data based on one of the branched signals of a first frequency;

converting one of the branched signals of a second frequency into regenerated power and outputting the regenerated power; and combining the regenerated power and power supply power output from a voltage source as combined power and supplying the combined power to the power amplifier.

* * * * *